(12) United States Patent
Ma et al.

(10) Patent No.: US 11,496,703 B2
(45) Date of Patent: Nov. 8, 2022

(54) HIGH CONVERSION GAIN AND HIGH FILL-FACTOR IMAGE SENSORS WITH PUMP-GATE AND VERTICAL CHARGE STORAGE WELL FOR GLOBAL-SHUTTER AND HIGH-SPEED APPLICATIONS

(71) Applicant: Trustees of Dartmouth College, Hanover, NH (US)

(72) Inventors: Jiaju Ma, Monrovia, CA (US); Eric R. Fossum, Hanover, NH (US)

(73) Assignee: Trustees of Dartmouth College, Hanover, NH (US)

( * ) Notice: Subject to any disclaimer, the term of this patent is extended or adjusted under 35 U.S.C. 154(b) by 171 days.

(21) Appl. No.: 16/938,939

(22) Filed: Jul. 25, 2020

(65) Prior Publication Data

US 2021/0029321 A1    Jan. 28, 2021

Related U.S. Application Data

(60) Provisional application No. 62/878,393, filed on Jul. 25, 2019.

(51) Int. Cl.
| | |
|---|---|
| *H04N 5/3745* | (2011.01) |
| *H04N 5/378* | (2011.01) |
| *H01L 27/146* | (2006.01) |

(52) U.S. Cl.
CPC ..... *H04N 5/37452* (2013.01); *H01L 27/1461* (2013.01); *H04N 5/378* (2013.01)

(58) Field of Classification Search
CPC .......... H04N 5/37452; H04N 5/378; H01L 27/1461; H01L 27/14603; H01L 27/14641; H01L 27/14612; H01L 27/1464
See application file for complete search history.

(56) References Cited

U.S. PATENT DOCUMENTS

| | | |
|---|---|---|
| 5,055,900 A | 10/1991 | Fossum et al. |
| 5,841,126 A | 11/1998 | Fossum et al. |
| 6,005,619 A | 12/1999 | Fossum |
| 6,021,172 A | 2/2000 | Fossum et al. |
| 6,166,768 A | 12/2000 | Fossum et al. |
| 6,320,617 B1 | 11/2001 | Gee et al. |
| 6,388,243 B1 | 5/2002 | Berezin et al. |
| 6,429,036 B1 | 8/2002 | Nixon et al. |
| 6,445,022 B1 | 9/2002 | Bama et al. |

(Continued)

FOREIGN PATENT DOCUMENTS

| | | |
|---|---|---|
| WO | 2019227066 A1 | 11/2019 |
| WO | 2019227067 A1 | 11/2019 |

*Primary Examiner* — Nhan T Tran
(74) *Attorney, Agent, or Firm* — Jacobsen IP Law; Krista S. Jacobsen

(57) ABSTRACT

Disclosed herein are image apparatuses comprising a frontside surface, a backside surface, a storage region (e.g., a storage node or a floating diffusion node), the storage region being situated closer to the frontside surface than to the backside surface, a storage well situated between the backside surface and the storage region, and a doping region situated between the storage region and the storage well. An impurity type of the doping region is opposite an impurity type of the storage well. A lateral area of the storage well is greater than or equal to a lateral area of the storage region, and no portion of a lateral perimeter of the storage region extends outside of a lateral perimeter of the storage well.

35 Claims, 22 Drawing Sheets

(56) References Cited

U.S. PATENT DOCUMENTS

| | | | |
|---|---|---|---|
| 6,456,326 B2 | 9/2002 | Fossum et al. | |
| 6,486,503 B1 | 11/2002 | Fossum | |
| 6,504,142 B2 | 1/2003 | Nixon et al. | |
| 6,552,322 B1 | 4/2003 | Campbell et al. | |
| 6,624,456 B2 | 9/2003 | Fossum et al. | |
| 6,667,768 B1 | 12/2003 | Fossum | |
| 6,744,084 B2 | 6/2004 | Fossum | |
| 6,787,749 B1 | 9/2004 | Zhou et al. | |
| 6,888,122 B2 | 5/2005 | Fossum | |
| 7,026,596 B2 | 4/2006 | Fossum | |
| 7,190,398 B1 | 3/2007 | Yadid-Pecht et al. | |
| 7,209,173 B2 | 4/2007 | Fossum | |
| 7,385,166 B2 | 6/2008 | Fossum | |
| 7,436,442 B2 | 10/2008 | Bama et al. | |
| 8,513,709 B2 | 8/2013 | Jin et al. | |
| 8,520,104 B2 | 8/2013 | Fossum et al. | |
| 8,625,016 B2 | 1/2014 | Fossum et al. | |
| 8,648,287 B1 | 2/2014 | Fossum | |
| 8,723,284 B1 * | 5/2014 | Hynecek | H01L 31/103 |
| | | | 257/292 |
| 8,994,867 B2 | 3/2015 | Wang et al. | |
| 9,728,565 B2 | 8/2017 | Fossum et al. | |
| 9,762,890 B2 | 9/2017 | Fossum et al. | |
| 10,163,968 B2 | 12/2018 | Anzagira et al. | |
| 10,283,539 B2 | 5/2019 | Fossum et al. | |
| 10,319,776 B2 * | 6/2019 | Ma | H01L 27/14621 |
| 10,340,305 B2 | 7/2019 | Ma et al. | |
| 10,523,886 B2 | 12/2019 | Fossum | |
| 10,580,820 B2 | 3/2020 | Masoodian et al. | |
| 10,652,497 B2 | 5/2020 | Fossum et al. | |
| 10,659,715 B2 | 5/2020 | Endsley et al. | |
| 10,670,526 B2 | 6/2020 | Xu et al. | |
| 10,674,098 B1 | 6/2020 | Fossum | |
| 2009/0200585 A1 * | 8/2009 | Nozaki | H01L 27/14643 |
| | | | 257/292 |
| 2010/0181465 A1 | 7/2010 | Fossum | |
| 2012/0241591 A1 | 9/2012 | Wan et al. | |
| 2012/0281126 A1 | 11/2012 | Fossum | |
| 2015/0301267 A1 | 10/2015 | Ouderkirk et al. | |
| 2016/0172397 A1 | 6/2016 | Ma et al. | |
| 2017/0117315 A1 | 4/2017 | Chen et al. | |
| 2018/0190697 A1 * | 7/2018 | Lee | H01L 27/14636 |
| 2018/0233620 A1 * | 8/2018 | Wang | H01L 27/1464 |
| 2019/0098241 A1 | 3/2019 | Fossum et al. | |
| 2020/0068156 A1 | 2/2020 | Ma et al. | |
| 2021/0202550 A1 * | 7/2021 | Ma | H04N 5/3745 |

* cited by examiner

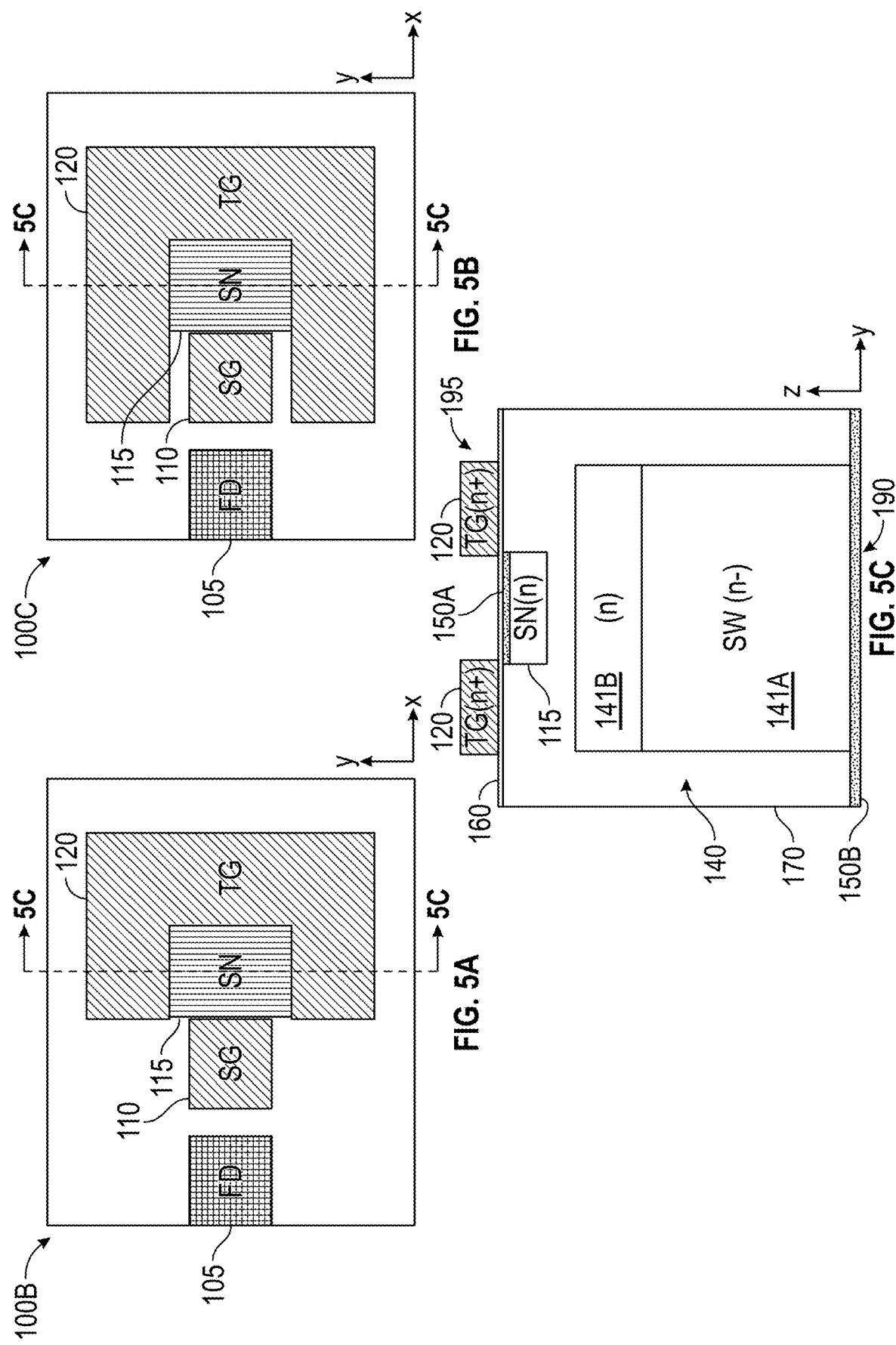

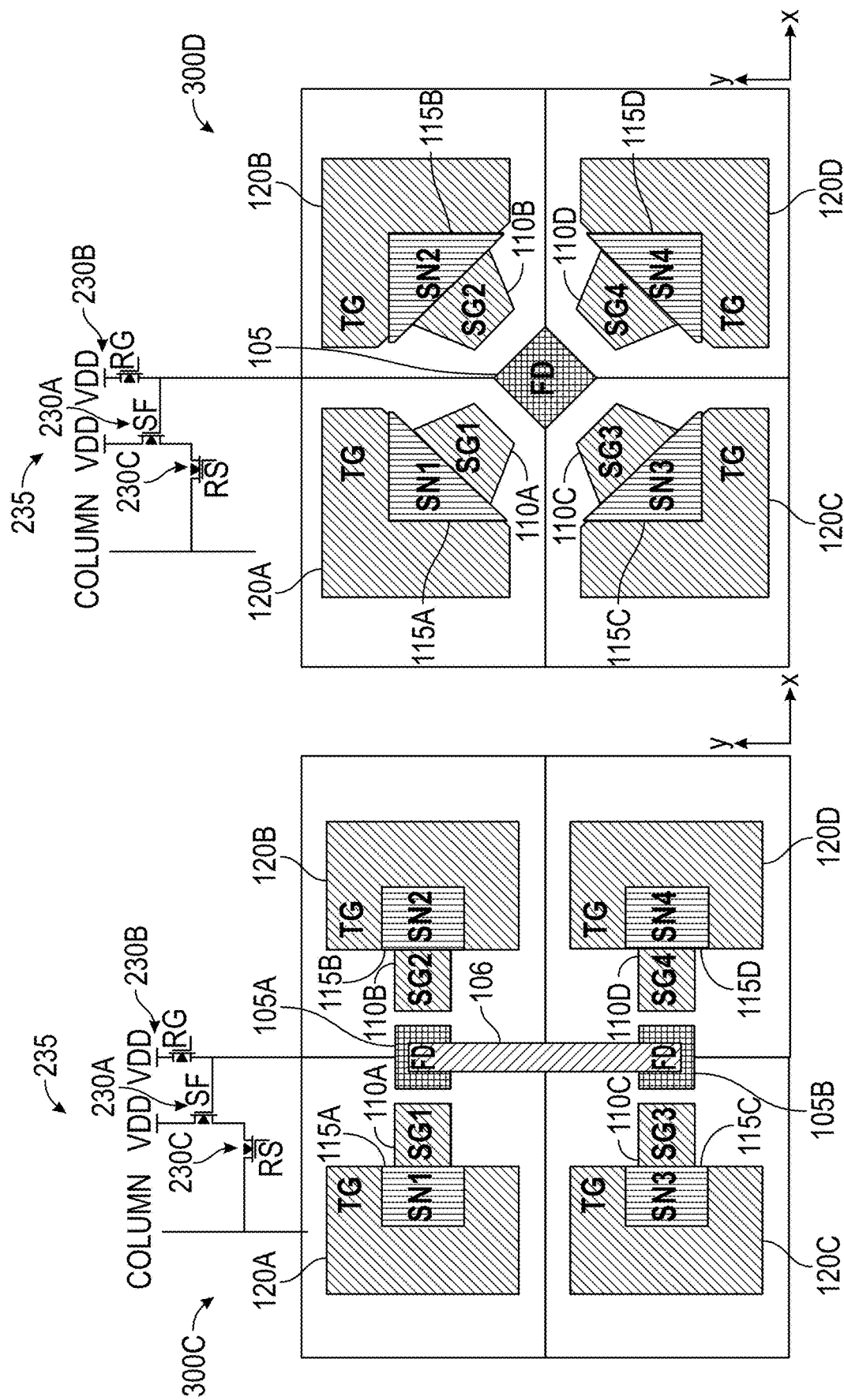

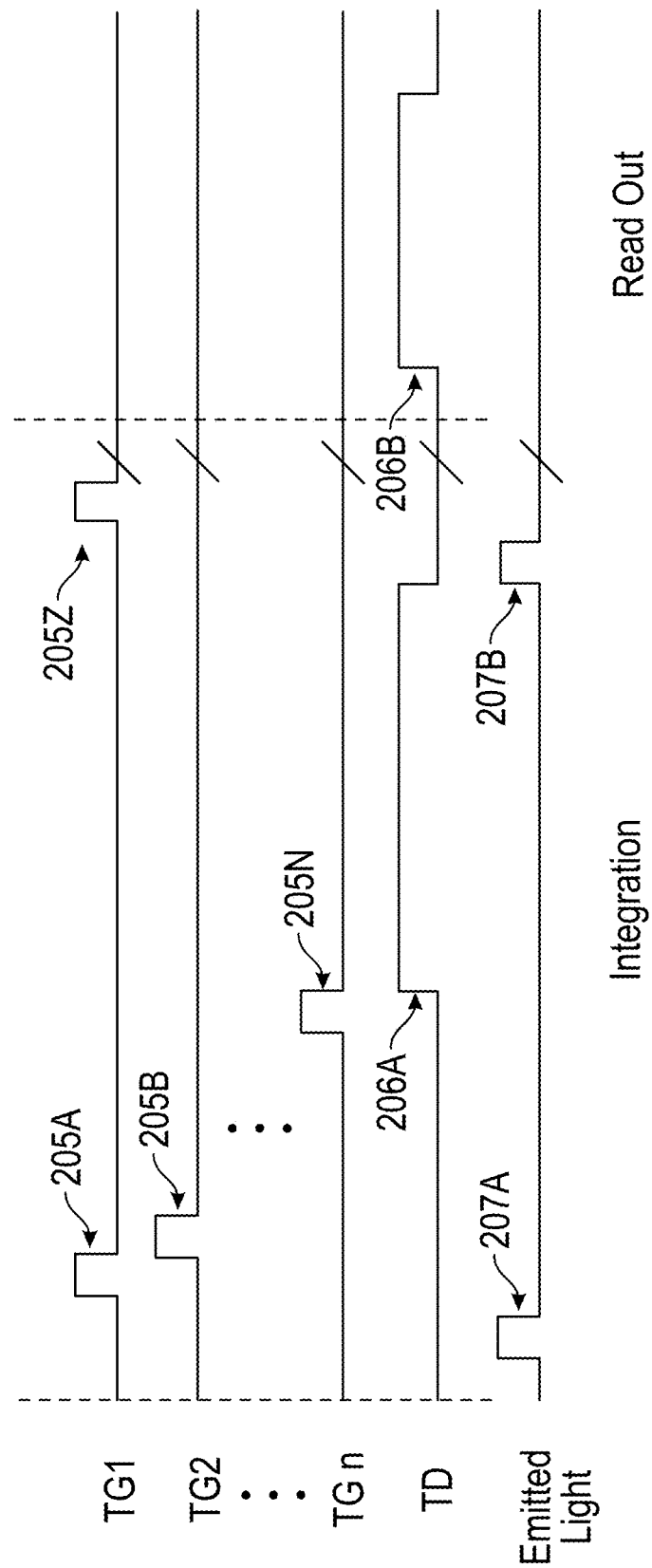

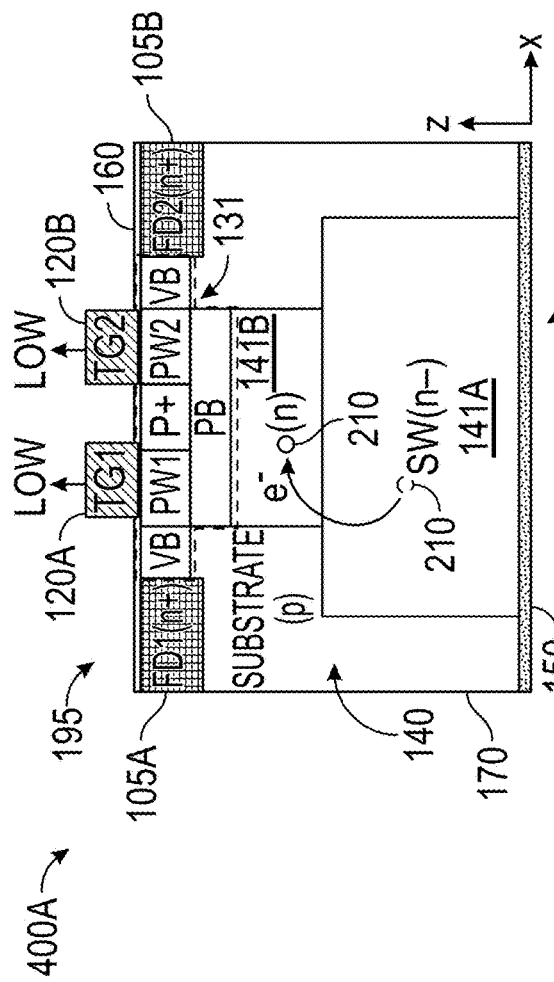
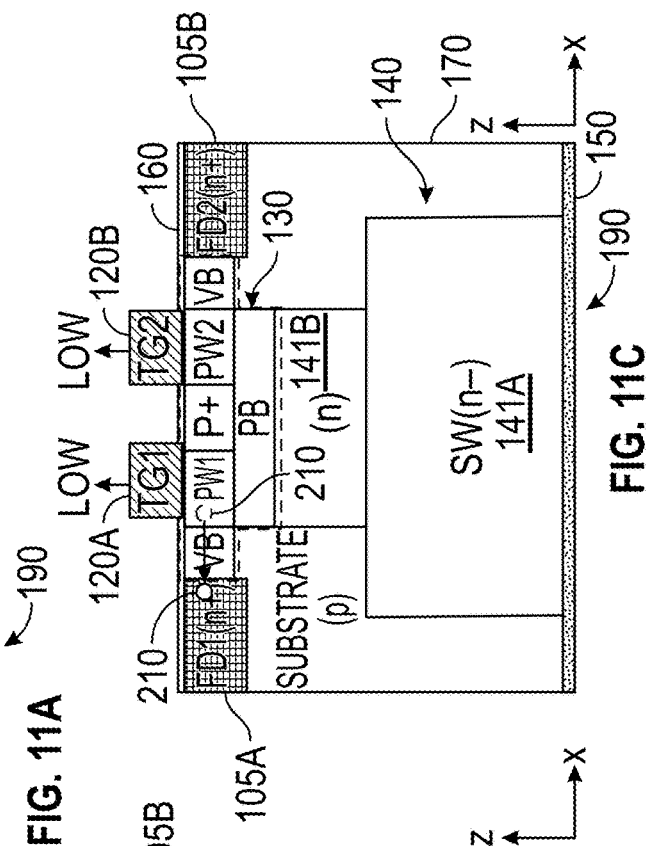
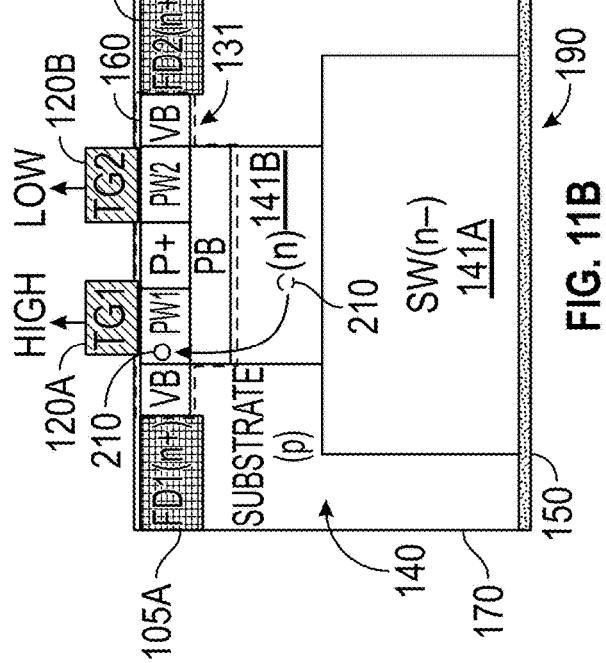

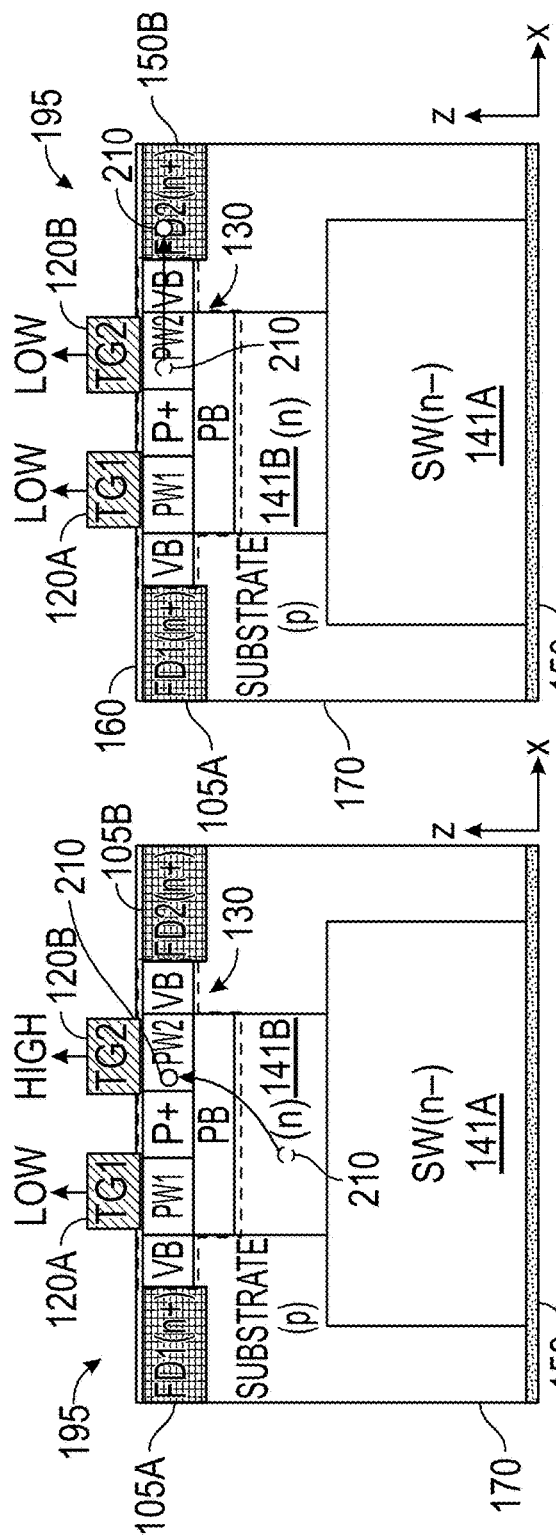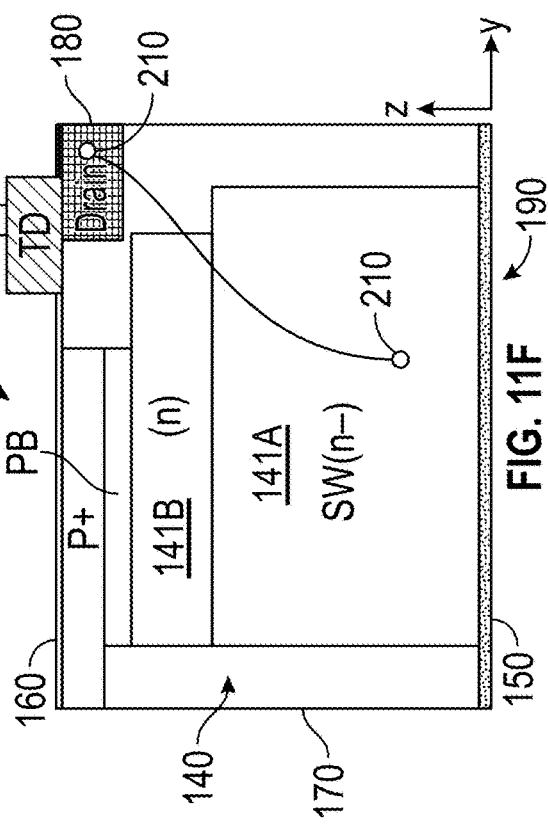

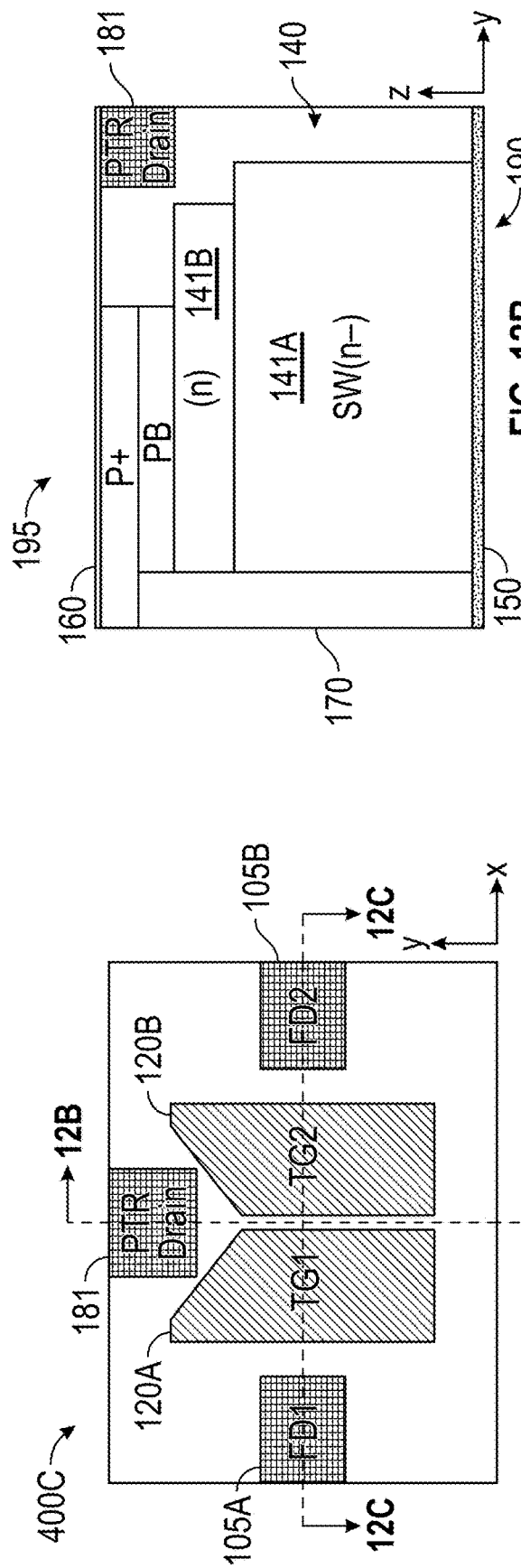
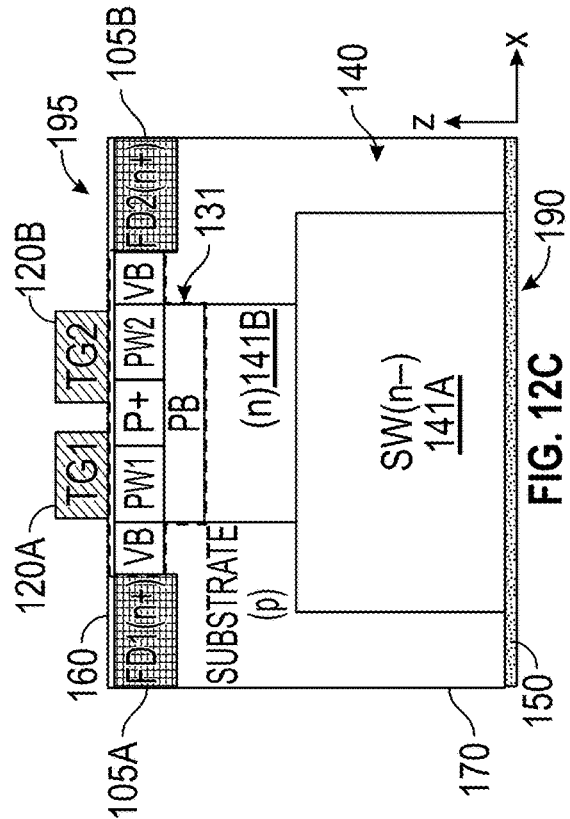
FIG. 12A
FIG. 12B
FIG. 12C

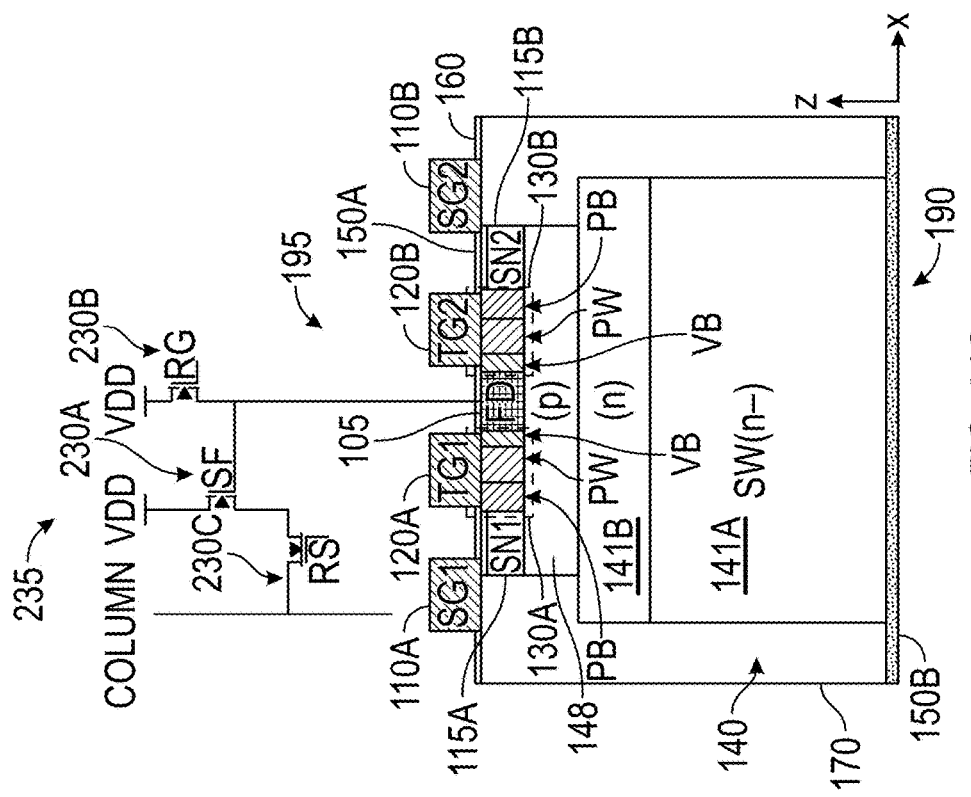
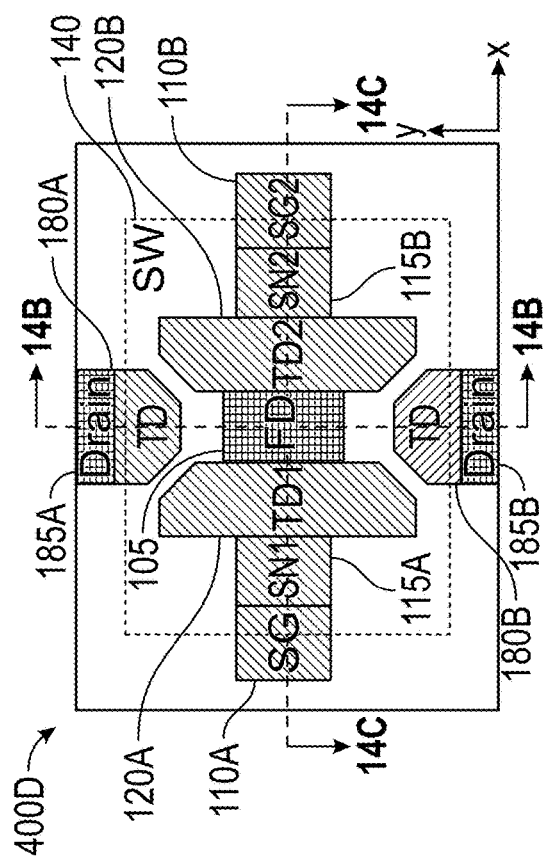
FIG. 14A
FIG. 14B
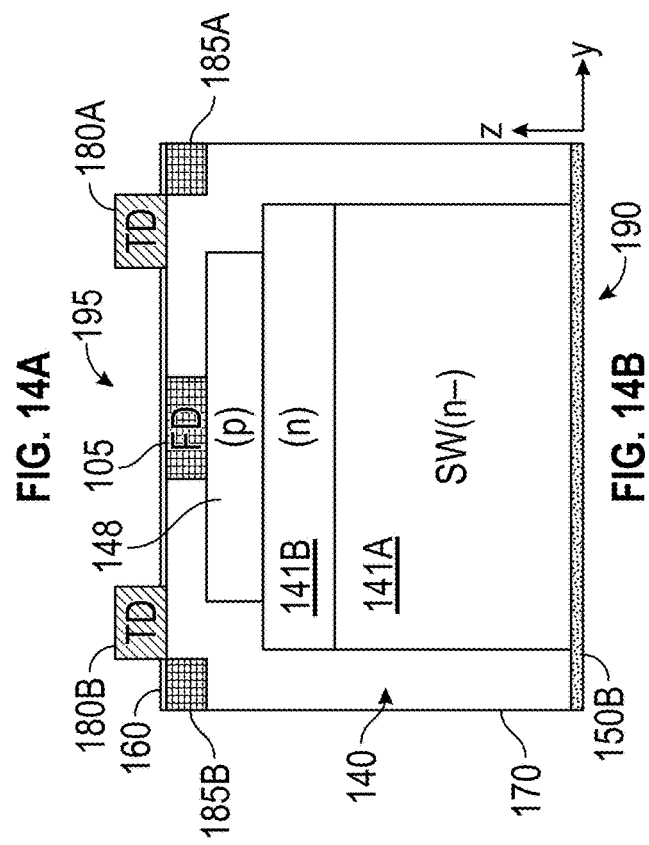
FIG. 14C

HIGH CONVERSION GAIN AND HIGH FILL-FACTOR IMAGE SENSORS WITH PUMP-GATE AND VERTICAL CHARGE STORAGE WELL FOR GLOBAL-SHUTTER AND HIGH-SPEED APPLICATIONS

CROSS-REFERENCE TO RELATED APPLICATIONS

This application claims the benefit of, and hereby incorporates by reference for all purposes the entirety of the contents of, U.S. Provisional Application No. 62/878,393, filed on Jul. 25, 2019 and entitled "HIGH CONVERSION GAIN AND HIGH FILL-FACTOR IMAGE SENSORS WITH PUMP-GATE AND VERTICAL CHARGE STORAGE WELL FOR GLOBAL-SHUTTER AND HIGH-SPEED APPLICATIONS."

This invention was made with government support under grant number W911NF-16-2-0162 awarded by the U.S. Department of Defense. The government has certain rights in the invention.

BACKGROUND

Many electronic devices, such as cameras and mobile devices (e.g., tablets, phones, etc.) include imaging systems (e.g., to take photos). Modern image sensors typically include a number of light-sensitive picture elements ("pixels") arranged in a two-dimensional array (e.g., a rectangular array) coupled to circuitry for reading and controlling the pixel array. After each pixel has acquired its image data (e.g., by collecting charge during an exposure period), the image data is read out by the readout circuitry, which may include amplification circuitry, analog-to-digital conversion circuitry, etc. A desire or need for image sensors with higher resolution and lower power consumption has encouraged the miniaturization and integration of these image sensors for some applications. As the pixels become smaller, however, their photosensitivity and dynamic range can be degraded.

High-speed image sensors for use in time-resolved imaging and global shutter applications are widely sought after. Such sensors can benefit many applications, such as scientific imaging, time-of-flight estimation, motion traction, augmented reality, etc. Thus, there is an ongoing need for high-speed image sensors that provide high performance in low- or sparse-light conditions for applications such as, for example, scientific imaging, time-of-flight estimation, motion traction, augmented reality, etc.

BRIEF DESCRIPTION OF THE DRAWINGS

Objects, features, and advantages of the disclosure will be readily apparent from the following description of certain embodiments taken in conjunction with the accompanying drawings in which:

FIG. 5A illustrates a layout of an exemplary detector in accordance with some embodiments.

FIG. 5B illustrates a layout of another exemplary detector in accordance with some embodiments.

FIG. 5C is a cross-sectional view applicable to both of the exemplary detectors illustrated in FIGS. 5A and 5B.

FIG. 7C illustrates an exemplary layout for an exemplary image sensor with four-way shared control and readout circuitry in accordance with some embodiments.

FIG. 7D illustrates another exemplary layout for an exemplary image sensor with four-way shared control and readout circuitry in accordance with some embodiments.

FIG. 10 is an exemplary control signal timing diagram for a multi-tap system in accordance with some embodiments.

FIGS. 11A, 11B, 11C, 11D, 11E, and 11F illustrate how charge can be transferred by the exemplary detector illustrated in FIGS. 9A-9C in accordance with some embodiments.

FIG. 12A illustrates an exemplary layout for an exemplary multi-tap detector with a punch-through reset drain in accordance with some embodiments.

FIGS. 12B and 12C illustrate cross-sectional views of the exemplary detector of FIG. 12A in accordance with some embodiments.

FIG. 14A illustrates an exemplary layout for an exemplary multi-tap time-resolved pump-gate detector with pinned storage nodes and shared control and readout circuitry in accordance with some embodiments.

FIG. 14B illustrates a cross-sectional view of the exemplary detector of FIG. 14A in accordance with some embodiments.

FIG. 14C illustrates a cross-sectional view of the exemplary detector of FIG. 14A with exemplary control and readout circuitry in accordance with some embodiments.

Figure 1:
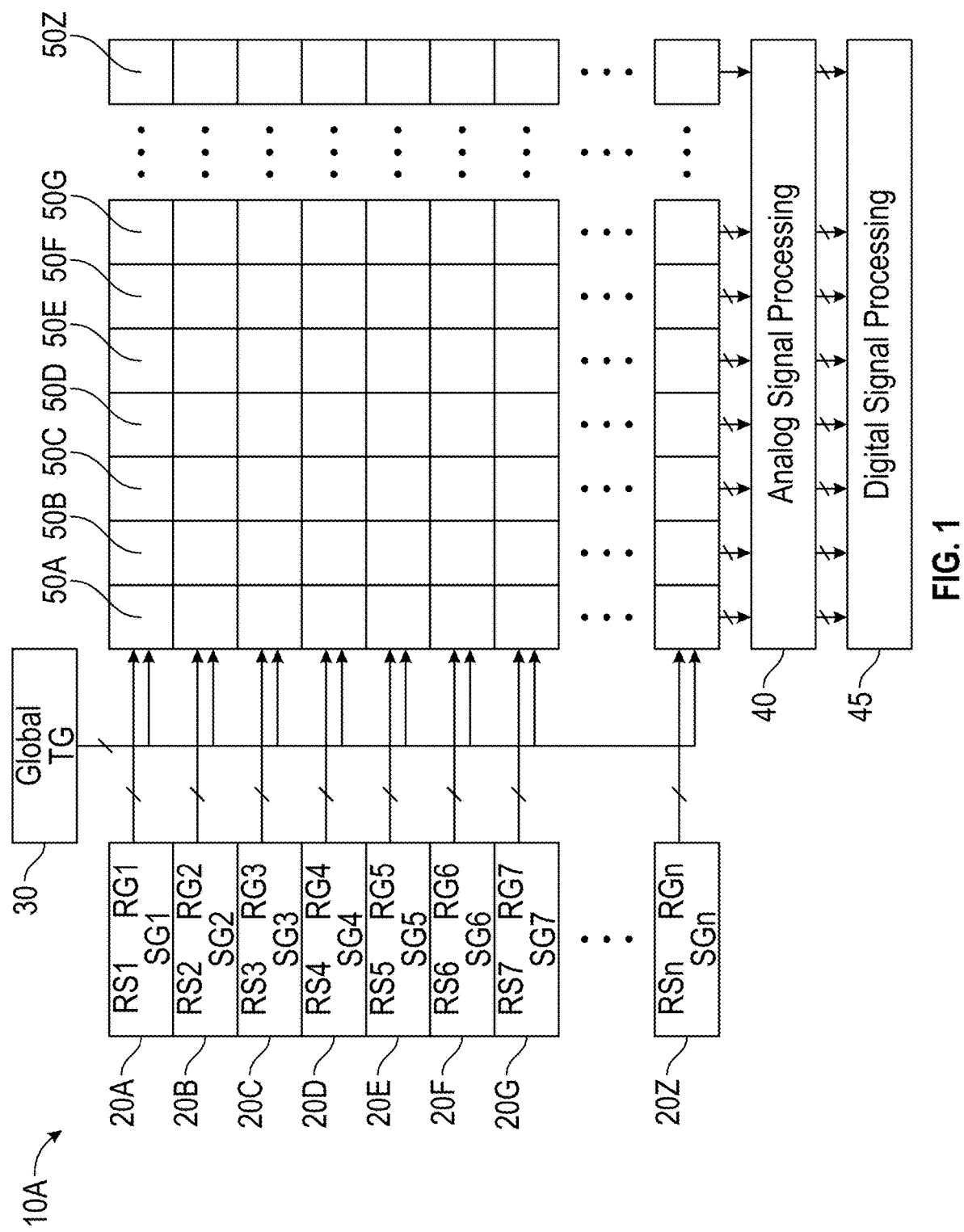
FIG. 1 is an illustration of an exemplary global-shutter image sensor in accordance with some embodiments.

To facilitate understanding, identical reference numerals have been used, where possible, to designate identical elements that are common to the figures. It is contemplated that elements disclosed in one embodiment may be beneficially utilized in other embodiments without specific recitation. Moreover, unless otherwise indicated, the description of an element in the context of one drawing is applicable to other drawings illustrating that element. To avoid obscuring the drawings unnecessarily, some drawings omit reference numbers for some elements. It will be appreciated that various of the drawings are interrelated and show different aspects of the concepts disclosed herein, and they should be considered together. Accordingly, the identities of unlabeled elements will be clear from their presence in other drawings.

DETAILED DESCRIPTION

The terms "pixel" and "detector" are used interchangeably herein.

Two modes used in imaging devices and systems for reading image data from a pixel array are known as "rolling shutter" and "global shutter." An imaging system or device operating in the rolling shutter mode exposes and reads out adjacent rows of a pixel array at different times, with each row read after its exposure has been completed. Consequently, the exposure of each row is slightly offset in time from its neighbors. Although each row is subject to the same exposure time, the row at one end of the pixel array (e.g., the top row of the array) will have ended its exposure a certain time prior to the end of the exposure of the row at the other end (e.g., the bottom row of the array). The time difference depends on the number of rows and the offset in time between adjacent rows. As a result of the time difference, spatial distortion can result from rolling shutter mode. The distortion increases, for example, when objects are moving at a rate that is faster than the readout rate. A potential benefit of rolling shutter mode is that it may provide a larger fill-factor, higher quantum efficiency, larger full-well capacity and dynamic range than global shutter mode.

When an imaging system or device operates in the global shutter mode, all pixels are exposed simultaneously and for the same length of time in a manner similar to how a mechanical shutter operates on a legacy "snapshot" camera. Thus, global shutter mode simultaneously exposes all pixels of the pixel array, thereby avoiding the distortion that can result from rolling shutter mode due to differences in exposure timing for different rows of the pixel array. Before the exposure (referred to as the integration period) begins, all of the pixels in the pixel array are reset by draining all of their charge, and they are held in that state by control circuitry until the exposure begins. While the pixels are being reset, and before the integration period begins, the pixels do not accumulate signal charge related to incident radiation. At the start of the integration period, all of the pixels simultaneously begin to collect charge (or at least are in a state in which they are able to collect charge), and they continue to do so for the duration of the integration period. At the end of the integration period, each pixel transfers its signal charge to a readout node.

One way to implement global shutter pixels is by using a photodiode and a memory element within each pixel of the image sensor array. The photodiode collects signal charge during an exposure. The memory element, referred to herein as an in-pixel storage node (abbreviated as "SN"), temporarily stores photo-generated charges and allows each pixel in the image sensor array to be exposed at the same time. At the end of the exposure time, photo-generated charge carriers are transferred from photodiodes to the in-pixel memory nodes.

Some types of modern imaging systems, whether rolling shutter or global shutter, use integrated circuit (IC) image sensors (e.g., image sensors fabricated on a semiconductor substrate, such as silicon). Image sensors may be implemented in complementary metal-oxide semiconductor (CMOS) devices, which tend to have low power consumption, small size, fast data processing, a direct output of data, and a low manufacturing cost. Two types of image sensors that may be implemented in CMOS devices are referred to as frontside-illuminated (FSI) image sensors and backside-illuminated (BSI) image sensors.

An FSI CMOS imaging pixel may include a substrate upon which pixel circuitry is disposed and over which one or more metal layers are patterned to create an optical passage through which light incident on the frontside of imaging pixel can reach a photosensitive (or photodiode) region. The frontside may also include a color filter layer to implement a color sensor and a microlens to focus the light onto photodiode region.

One issue with FSI image sensors is that, as described above, the one or more metal layers are situated between the photosensitive region of the pixel and the lens. Therefore, they can prevent some of the light from reaching the photo-sensitive region of the pixel, which degrades image quality, especially in low-light conditions. Nevertheless, global shutter pixels are often implemented as FSI image sensors because the metal layers (e.g., frontside shielding metals or reflective coatings) can prevent some or all incident radiation from striking the in-pixel storage node. By preventing at least some of the incident light from reaching the in-pixel storage node, the one or more metal layers can mitigate degradation of global shutter efficiency caused by the generation of parasitic electron-hole pairs within the in-pixel storage node (e.g., by preventing the parasitic electron-hole pairs from contaminating charges stored in the pixel-level storage node during an exposure).

Like FSI CMOS pixels, a BSI CMOS imaging pixel may also include a substrate with pixel circuitry, one or more metal layers, a color filter, and a microlens, but some of these components are arranged differently than in FSI pixels. For example, the color filter and microlens are on the backside of the pixel, whereas the one or more metal layers remain on the frontside. Thus, BSI image sensors detect light that is incident upon the backside of the sensor substrate. Incident light can then reach the photosensitive region of the pixel free of interference from the one or more metal layers on the frontside. Thus, the pixels in a BSI image sensor can capture more light than the pixels in a FSI sensor and thereby offer better quantum efficiency (and better low-light performance) than FSI image sensors because they do not have metal interconnect layers within an optical path of a photodiode (the photo-sensitive region of the pixel). But because BSI image sensors do not have overlying metal interconnect layers to shield pixel-level memory nodes from incident radiation, they can be at a disadvantage relative to FSI image sensors with respect to global shutter efficiency. For BSI image sensors, the shielding to protect the in-pixel memory node becomes more complicated because the metals or reflective coatings on the backside cannot block the incident light sufficiently due to the diffraction of the light and the diffusion of the signal charge through the silicon bulk. It is to be appreciated that backside metal cannot completely prevent the diffracted light from going into the storage node, nor can it prevent the electrons generated in the substrate from being diffused to the storage node. Both effects are due to a long distance and optical path between the shielding and the storage node. Some sensors use vertical reflectors formed with deep trench isolation (DTI) structures on the backside to shield the storage node from light with larger chief angles. A substantial drawback of this approach is that it tends to significantly reduce the sensor fill-factor. (See, e.g., U.S. Patent Pub. No. 2017/0117315.)

One way to improve the low- or sparse-light performance of an image sensor is to reduce the input-referred noise floor (e.g., read noise) of the sensor. Reducing the read noise also helps to improve the dynamic range of the sensor, which can be important for certain applications (e.g., high dynamic range imaging, automotive, computer vision, etc.). One way to reduce the read noise is to design a detector with high conversion gain. U.S. Patent Pub. No. 2015/0301267 describes an image sensor with pump-gate detectors to purportedly improve the conversion gain and, thus, low-light performance. A drawback of this architecture, however, is that it is limited to application within a rolling shutter image sensor.

Disclosed herein are devices and methods that provide high performance (e.g., high conversion gain) without degrading the sensor fill-factor. Some sensor embodiments use a pump gate structure and a vertical charge storage well. The disclosed sensors are suitable for use in high-speed global-shutter applications.

In some embodiments, an image sensor apparatus comprises a frontside surface, a backside surface, a storage region, a storage well, and a doping region situated between the storage region and the storage well. The storage region may be, for example, a storage node or a floating diffusion node. In some such embodiments, the storage region is situated closer to the frontside surface than to the backside surface, and the storage well is situated between the backside surface and the storage region. In some embodiments, a lateral area of the storage well is greater than or equal to a lateral area of the storage region, and no portion of a lateral perimeter of the storage region extends outside of a lateral perimeter of the storage well. As a result, the storage well "blocks" incident light impinging on the backside surface that might otherwise reach the storage region.

In some embodiments, a pinning layer (e.g., a heavily-doped pinning layer) is disposed between the storage region and the frontside surface, the pinning layer being situated adjacent to the storage region.

In some embodiments, the image sensor apparatus also includes a transfer gate formed on the frontside surface. In some embodiments, the transfer gate is configured to cause charge to transfer from the storage well to the storage region in response to a bias applied to the transfer gate. The transfer gate may be situated over at least a portion of the storage well. In some embodiments, in a plan view of the image sensor apparatus (e.g., from the frontside), the transfer gate extends laterally around at least a portion of the storage region, which may be, in such embodiments, a storage node.

In some embodiments, the storage well comprises a shallow region and a deep region, the deep region being situated between the backside surface and the shallow region. In some such embodiments, a doping of the shallow region is heavier than a doping of the deep region. In some embodiments, a lateral dimension of the shallow region in a first direction is smaller than a corresponding lateral dimension of the deep region in the first direction.

In some embodiments, the storage region is a storage node, and the image sensor apparatus also includes a floating diffusion node situated between the frontside surface and the backside surface (e.g., closer to the frontside surface than to the backside surface). The floating diffusion node may be coupled to circuitry (e.g., for controlling and/or reading the image sensor apparatus and/or the floating diffusion node). In some embodiments, the circuitry comprises at least one of a MOSFET transistor, a punch-through diode, or a JFET transistor.

In some embodiments having both a storage node and a floating diffusion node, the image sensor apparatus also includes a pump gate structure disposed between the storage node and the floating diffusion node. In some embodiments, the pump gate structure is configured to cause charge to transfer from the storage node to the floating diffusion node in response to a bias applied to a signal gate coupled to the pump gate structure. In some embodiments, the pump gate structure comprises a plurality of doping regions (e.g., a virtual barrier region, a p-type barrier region, and a p-type well region situated between the virtual barrier region and the p-type barrier region). In some embodiments having a multi-region pump gate structure, the p-type barrier region is adjacent to the storage node, and the virtual barrier region is adjacent to the floating diffusion node.

In some embodiments having a storage node and a floating diffusion node, the image sensor apparatus also includes a signal gate formed on the frontside surface. Some such embodiments also include a pump gate structure that is horizontal and is situated, at least in part, under the signal gate.

In some embodiments, in addition to a storage node, a floating diffusion node, a pump gate structure, and a signal gate, the image sensor apparatus also includes a transfer gate formed on the frontside surface, wherein the transfer gate is configured to cause charge to transfer from the storage well to the storage node in response to a bias applied to the transfer gate.

In some embodiments having a storage node, a floating diffusion node, a transfer gate, and a signal gate, a method of using the image sensor apparatus comprises biasing the transfer gate at a first time, biasing the signal gate at a second time, the second time being after the first time, and reading the floating diffusion node after biasing the signal gate at the second time. In some embodiments, the method also comprises resetting the floating diffusion node before biasing (e.g., pulsing) the transfer gate at the first time. In some embodiments, reading the floating diffusion node comprises performing correlated double sampling.

In some embodiments, the storage region is a first storage node and the storage well is a first storage well, and the image sensor apparatus further comprises a second storage node situated closer to the frontside surface than to the backside surface, a second storage well situated between the backside surface and the second storage node, wherein a lateral area of the second storage well is greater than or equal to a lateral area of the second storage node, and no portion of the lateral perimeter of the second storage node extends outside of the lateral perimeter of the second storage well. In some such embodiments, the image sensor apparatus also includes a floating diffusion node disposed between the first and second storage nodes, circuitry coupled to the floating diffusion node, a first transfer gate formed on the frontside surface and configured to cause a first charge to transfer from the first storage well to the first storage node in response to a voltage applied to the first transfer gate, a first signal gate formed on the frontside surface and configured to cause the first charge to transfer from the first storage node to the floating diffusion node in response to a voltage applied to the first signal gate, a second transfer gate formed on the frontside surface and configured to cause a second charge to transfer from the second storage well to the second storage node in response to a voltage applied to the second transfer gate, and a second signal gate formed on the frontside surface and configured to cause the second charge to transfer from the second storage node to the floating diffusion node in response to a voltage applied to the second signal gate.

In some embodiments, the image sensor apparatus further comprises a first pump gate structure disposed between the first storage node and the floating diffusion node, wherein the first pump gate structure is configured to direct the first charge from the first storage node to the floating diffusion node in response to the voltage applied to the first signal gate, the first signal gate being coupled to the first pump gate structure, and a second pump gate structure disposed between the second storage node and the floating diffusion node, wherein the second pump gate structure is configured to direct the second charge from the second storage node to the floating diffusion node in response to the voltage applied to the second signal gate, the second signal gate being coupled to the second pump gate structure.

In some embodiments, the floating diffusion node is a first floating diffusion node, and the image sensor apparatus further comprises a third storage node situated closer to the frontside surface than to the backside surface, a third storage well situated between the backside surface and the third storage node, a fourth storage node, the fourth storage node being situated closer to the frontside surface than to the backside surface, a fourth storage well situated between the backside surface and the fourth storage node, a second floating diffusion node disposed between the third and fourth storage nodes and coupled to the first floating diffusion node, a third transfer gate formed on the frontside surface and configured to cause a third charge to transfer from the third storage well to the third storage node in response to a voltage applied to the third transfer gate, a third signal gate formed on the frontside surface and configured to cause the third charge to transfer from the third storage node to the second floating diffusion node in response to a voltage applied to the third signal gate, a fourth transfer gate formed on the frontside surface and configured to cause a fourth charge to transfer from the fourth storage well to the fourth storage node in response to a voltage applied to the fourth transfer gate, and a fourth signal gate formed on the frontside surface and configured to cause the fourth charge to transfer from the fourth storage node to the second floating diffusion node in response to a voltage applied to the fourth signal gate. In some such embodiments, the circuitry is coupled to the first and second floating diffusion nodes.

In some embodiments, the image sensor apparatus also includes a third storage node situated closer to the frontside surface than to the backside surface, a third storage well situated between the backside surface and the third storage node, a fourth storage node situated closer to the frontside surface than to the backside surface, a fourth storage well situated between the backside surface and the fourth storage node, a third transfer gate formed on the frontside surface and configured to cause a third charge to transfer from the third storage well to the third storage node in response to a voltage applied to the third transfer gate, a third signal gate formed on the frontside surface configured to cause the third charge to transfer from the third storage node to the floating diffusion node in response to a voltage applied to the third signal gate, a fourth transfer gate formed on the frontside surface configured to cause a fourth charge to transfer from the fourth storage well to the fourth storage node in response to a voltage applied to the fourth transfer gate, and a fourth signal gate formed on the frontside surface configured to cause the fourth charge to transfer from the fourth storage node to the floating diffusion node in response to a voltage applied to the fourth signal gate.

In some embodiments, the storage region comprises a floating diffusion node. In some embodiments in which the storage region comprises a floating diffusion node, the image sensor apparatus further comprises a first storage node, a second storage node, a first horizontal pump gate structure situated between and adjacent to the first storage node and a first side of the floating diffusion node, and a second horizontal pump gate structure situated between and adjacent to the second storage node and a second side of the floating diffusion node. In some such embodiments, each of the first and second horizontal pump gate structures is a multi-layer structure comprising a p-type barrier region, a virtual barrier region, and a p-type well region sandwiched between the p-type barrier region and the virtual barrier region. In some embodiments, each of the virtual barrier regions is adjacent to the floating diffusion node.

In some embodiments in which the image sensor has a floating diffusion node, first and second storage nodes, and first and second horizontal pump gate structures situated between, respectively, the first and second storage nodes and the floating diffusion node, the image sensor further comprises first and second signal gates and first and second transfer gates formed on the frontside surface. In some embodiments, the first signal gate is configured to cause first signal charge to transfer from the storage well to the first storage node in response to a first bias applied to the first signal gate, and the second signal gate is configured to cause second signal charge to transfer from the storage well to the second storage node in response to a second bias applied to the second signal gate. In some such embodiments, the first transfer gate is situated above the first pump gate structure and is configured to cause the first signal charge to transfer from the first storage node, through the first pump gate structure, and to the floating diffusion node in response to a third bias applied to the first transfer gate, and the second transfer gate is situated above the second pump gate structure and is configured to cause the second signal charge to transfer from the second storage node, through the second pump gate structure, and to the floating diffusion node in response to a fourth bias applied to the second transfer gate. In some embodiments, the image sensor apparatus further comprises circuitry (e.g., at least one transistor or diode) coupled to the floating diffusion node.

In some embodiments in which storage region comprises a floating diffusion node, the image sensor apparatus further comprises a drain region and a transfer drain gate formed on the frontside surface, wherein the transfer drain gate is configured to cause excess charge to transfer from the storage well to the drain region in response to a bias applied to the transfer drain gate.

In some embodiments, an image sensor with a frontside surface and a backside surface includes a storage well situated between the backside surface and the frontside surface, a pump gate structure situated between the storage well and the frontside surface, a first doping region of the pump gate structure being adjacent to the storage well, a first floating diffusion node situated adjacent to a first side of the pump gate structure, a second floating diffusion node situated adjacent to a second side of the pump gate structure, a first transfer gate configured to direct charge from the storage well to the first floating diffusion node in response to a bias applied to the first transfer gate, and a second transfer gate configured to direct the charge from the storage well to the second floating diffusion node in response to a bias applied to the second transfer gate.

In some embodiments, the storage well comprises a shallow region and a deep region, the deep region being situated between the backside surface and the shallow region. In some such embodiments, a doping of the shallow region is heavier than a doping of the deep region.

In some embodiments, the image sensor also includes circuitry coupled to the first and second floating diffusion nodes. In some embodiments, the circuitry comprises at least one of a MOSFET transistor, a punch-through diode, or a JFET transistor.

In some embodiments, the pump gate structure comprises a plurality of doping regions. For example, in some embodiments, the pump gate structure comprises a p-type barrier adjacent to the storage well and a multi-layer structure situated (a) between the p-type barrier and the frontside surface and (b) between the first and second floating diffusion nodes. In some such embodiments, the multi-layer structure comprises a first virtual barrier region, a first p-type well region, a p-type region, a second p-type well region, and a second virtual barrier region, wherein the first and second p-type well regions are situated between the first and second virtual barrier regions, and the p-type region is situated between the first and second p-type well regions. In some embodiments, a doping of the p-type region is higher than a doping of the first p-type well region and a doping of the second p-type well region. In some embodiments, the first virtual barrier region is adjacent to the first floating diffusion node, and the second virtual barrier region is adjacent to the second floating diffusion node.

In some embodiments, the image sensor also includes a drain region and a transfer drain gate formed on the frontside surface, and the transfer drain gate is configured to cause charge to transfer from the storage well to the drain region in response to a bias applied to the transfer drain gate.

In some embodiments, the image sensor also includes a punch-through reset drain configured to cause charge to transfer from the storage well in response to a bias exceeding a threshold.

In some embodiments, a backside illumination (BSI) image sensor device comprises a frontside surface, a backside surface, a floating diffusion node, a storage well situated between the backside surface and the floating diffusion node, a first storage node, a second storage node, a first horizontal pump gate structure situated between and adjacent to the first storage node and a first side of the floating diffusion node, and a second horizontal pump gate structure situated between and adjacent to the second storage node and a second side of the floating diffusion node. In some such embodiments, each of the first and second horizontal pump gate structures is a multi-layer structure comprising a p-type barrier region, a virtual barrier region, and a p-type well region sandwiched between the p-type barrier region and the virtual barrier region. In some embodiments, each of the virtual barrier regions is adjacent to the floating diffusion node.

In some embodiments, the BSI image sensor device also comprises a first signal gate formed on the frontside surface, a second signal gate formed on the frontside surface, a first transfer gate formed on the frontside surface above the first pump gate structure, and a second transfer gate formed on the frontside surface above the second pump gate structure. In some such embodiments, the first signal gate is configured to cause first signal charge to transfer from the storage well to the first storage node in response to a first bias applied to the first signal gate, the second signal gate is configured to cause second signal charge to transfer from the storage well to the first storage node in response to a second bias applied to the second signal gate, the first transfer gate is configured to cause the first signal charge to transfer from the first storage node, through the first pump gate structure, and to the floating diffusion node in response to a third bias applied to the first transfer gate, and the second transfer gate is configured to cause the second signal charge to transfer from the second storage node, through the second pump gate structure, and to the floating diffusion node in response to a fourth bias applied to the second transfer gate.

In some embodiments, the BSI image sensor device also includes circuitry coupled to the floating diffusion node. In some embodiments, the circuitry comprises at least one transistor or diode.

In some embodiments, the BSI image sensor device also includes a drain region and a transfer drain gate formed on the frontside surface, wherein the transfer drain gate is configured to cause excess charge to transfer from the storage well to the drain region in response to a bias applied to the transfer drain gate.

Various embodiments of improved image sensors and methods of using them are disclosed herein. In the following disclosure, numerous specific details are set forth in order to provide a thorough understanding. One skilled in the relevant art will recognize, however, that the techniques described herein can be practiced without one or more of the specific details, or with other methods, components, materials, etc. In some instances, well-known structures, materials, or operations are not shown or described in detail to avoid obscuring certain aspects.

The following disclosure provides many different embodiments, or examples, for implementing different features of the subject matter. Specific examples of components and arrangements are described below to simplify the disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

FIG. 1 is an illustration of an exemplary global-shutter image sensor apparatus 10A in accordance with some embodiments. The exemplary global-shutter image sensor apparatus 10A includes an array of detectors (also referred to as pixels or sensors), eight of which are labeled in FIG. 1 as 50A, 50B, 50C, 50D, 50E, 50F, 50G, and 50Z. The array of detectors can be of any suitable size. That the last detector in the first row is labeled as 50Z is for convenience and not to imply that there are exactly 26 detectors in each row of the array. It is to be understood that the global-shutter image sensor apparatus 10A may have any number of detectors 50A, 50B, etc. and, accordingly, any number of rows and any number of columns. The array can be of any size or shape.

Figure 2A:
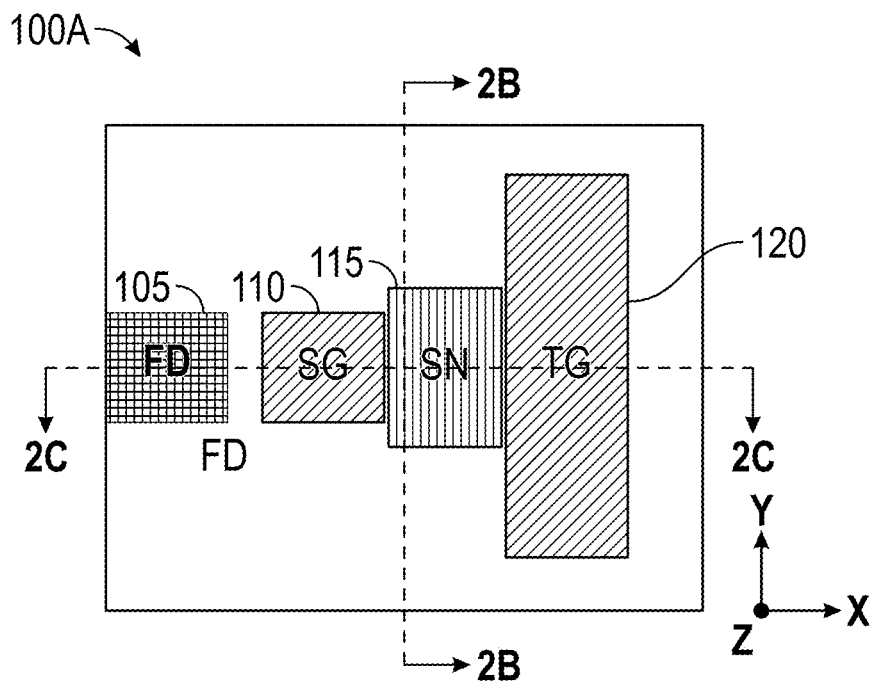
FIG. 2A illustrates a layout for an exemplary detector in accordance with some embodiments.
Figure 2B:
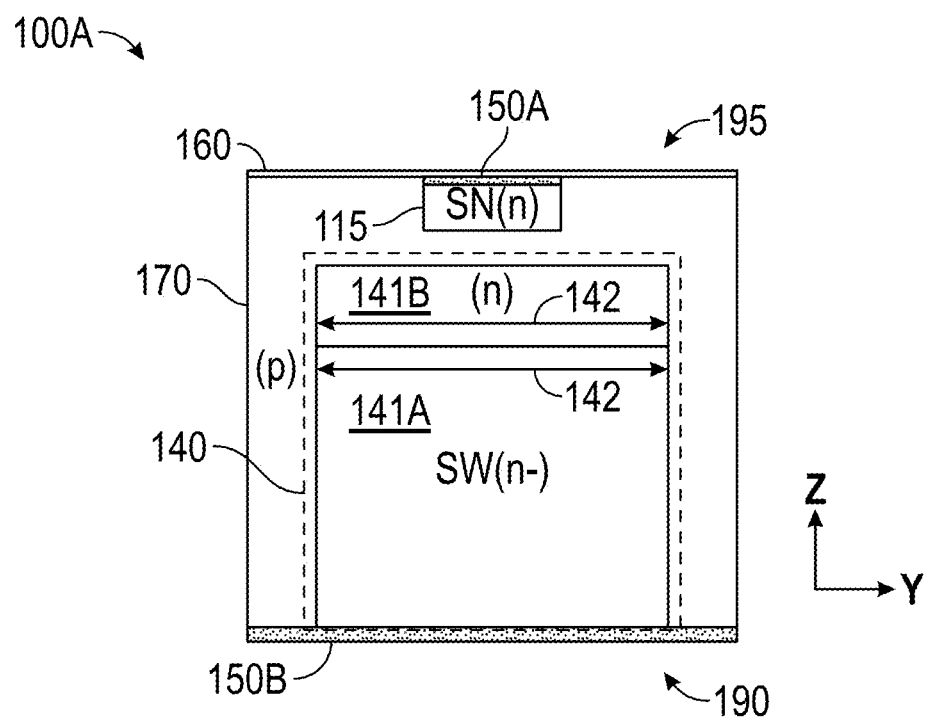
FIG. 2B is an exemplary cross-sectional view of the exemplary detector of FIG. 2A in accordance with some embodiments.
Figure 2C:
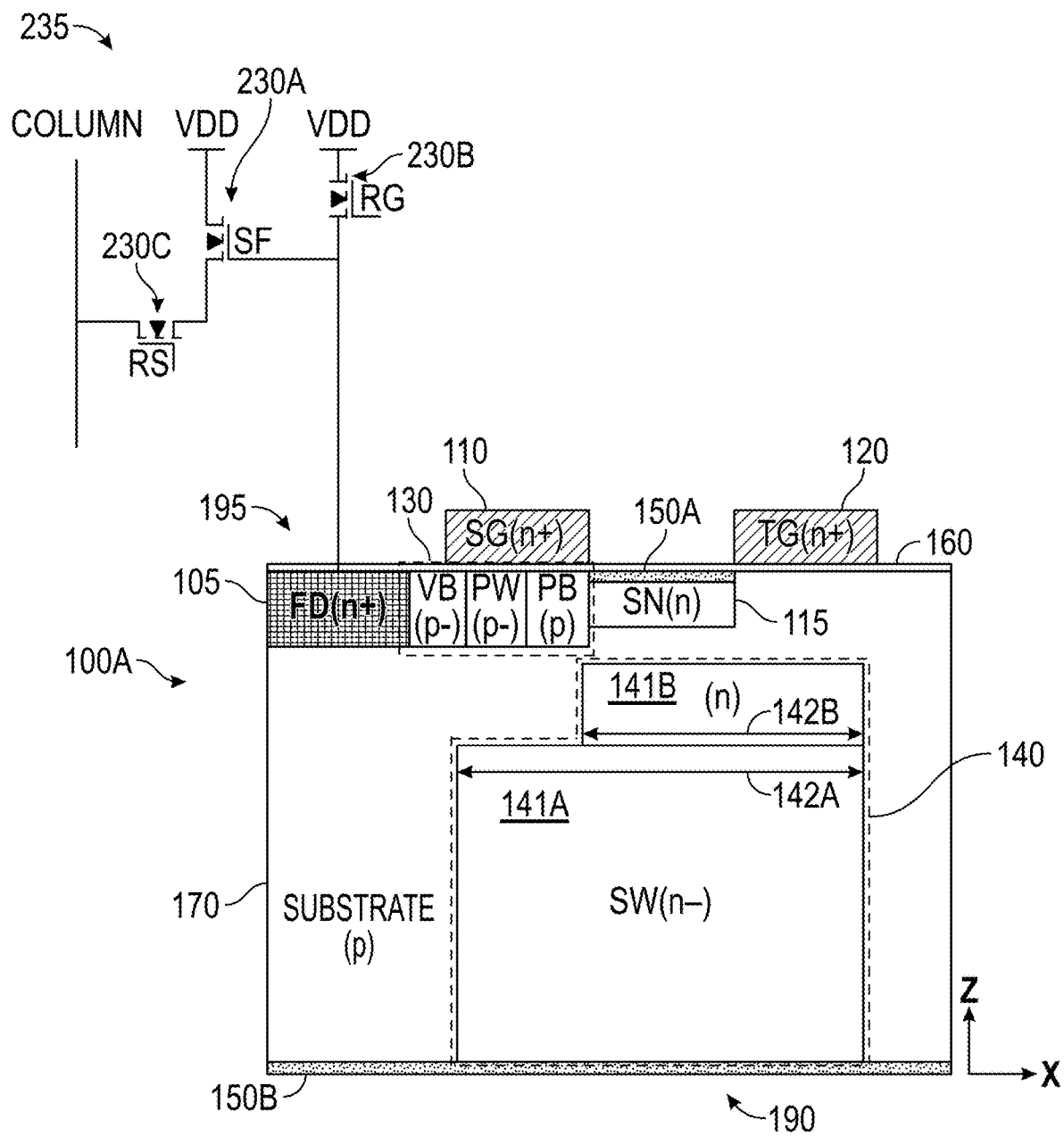
FIG. 2C illustrates a cross-sectional view of an exemplary detector of FIG. 2A shown with exemplary control and readout circuitry in accordance with some embodiments.

FIGS. 2A, 2B, and 2C illustrate portions of an exemplary backside-illuminated detector 100A that may be included in the exemplary global-shutter image sensor apparatus 10A (e.g., as the detectors 50A, 50B, etc.) in accordance with some embodiments. FIG. 2A is a plan view (from the frontside surface 195) of an exemplary layout for the exemplary detector 100A, and FIGS. 2B and 2C are cross-sectional views of the exemplary detector 100A at the locations indicated in FIG. 2A. It is to be understood that FIGS. 2A-2C (and other figures discussed herein) may not illustrate all of the elements that may be necessary or desirable to use the pixel or sensor. For example, the figures do not illustrate any filters or lenses that may be attached or coupled to the backside surface 190.

For convenience, certain aspects of the detector 100A (and other detectors shown and discussed herein) are described using a rectangular coordinate system. As shown in FIG. 2A, the plan view of the detector 100A is in an x-y plane, and the cross-sectional views of FIGS. 2B and 2C are in, respectively, y-z and x-z planes. With the rectangular coordinate system defined as described above, the dimensions of elements of the exemplary detector 100A in an x-y plane (at any value of z) are referred to herein as lateral dimensions. A lateral dimension may be in any arbitrary direction in the x-y plane. Although some lateral dimensions discussed herein are parallel to the x- and y-axes, a lateral dimension need not be parallel (or perpendicular) to the x- and y-axes.

The lateral area of an element is defined as the maximum area occupied by that element in an x-y plane over all possible values of z. The lateral perimeter of an element is defined as the element's perimeter in an x-y plane at the value of z corresponding to the lateral area. In other words, the lateral perimeter of an element is the outline of the lateral area of that element at some position in an x-y plane. Whereas the lateral area is a value, the lateral perimeter is a shape (e.g., rectangular, square, etc.) at a position in the x-y plane.

As shown in FIGS. 2B and 2C, the detector 100A is formed on/in a substrate 170, and it has a backside surface 190 and a frontside surface 195. In the illustrated example, the frontside surface 195 includes a layer of protective material 160, which may be, for example, an oxide. The detector 100A includes a pinned photodiode, shown as a pinned storage well (SW) 140, in which signal charge (typically photo-electrons) is initially accumulated during an exposure (or integration) period. A pinning layer 150B is adjacent to the storage well 140 at or near the backside surface 190 to define the maximum potential of the storage well 140. As will be appreciated by those having ordinary skill in the art, the pinning layer 150B is a backside passivation layer. The pinning layer 150B can be a heavily-doped layer like the frontside pinning layer 150A, or it can be, for example, a deposited thin-film of high-k material with fixed charge (e.g., $HfO_2$, $Al_2O_3$, etc.).

In the example detector 100A, the storage well 140 includes a deep region 141A and a shallow region 141B. The deep region 141A is close to the backside surface 190 of the detector 100A, and the shallow region 141B is situated between the deep region 141A and the frontside surface 195. In the illustrated example, the shallow region 141B is more heavily doped than the deep region 141A. As a result, the accumulated signal charge tends to migrate to the shallow region 141B, which means the maximum potential location is closer to the frontside surface 195 than to the backside surface 190. The different doping levels can be useful to more effectively transfer the accumulated charge out of the storage well 140. Although FIGS. 2B and 2C illustrate a storage well 140 that has two discrete doping levels, it is to be understood that other arrangements are possible. For example, the storage well 140 may be formed to have any suitable dopant-concentration gradient. It is to be appreciated that the storage well 140 could alternatively have a substantially uniform doping level.

The lateral dimensions of the deep region 141A and the shallow region 141B may be the same or different in various directions. For example, as shown in the example of FIG. 2B, the deep region 141A and the shallow region 141B may have substantially the same lateral dimension 142 in the y-direction (e.g., the span of the deep region 141A is substantially the span as the extent of the shallow region 141B in the y-direction). On the other hand, as shown in the example of FIG. 2C, the lateral dimension 142A of the deep region 141A in the x-direction is larger than the lateral dimension 142B of the shallow region 141B in the x-direction.

FIGS. 2B and 2C illustrate the storage well 140 as if it has well-defined and linear boundaries, but it is to be understood that because, in some embodiments, the storage well 140 is the result of a semiconductor doping procedure, the extent, size, and shape of the storage well 140 in an implementation may not be as well-defined or neat as FIGS. 2B and 2C suggest. Similarly, as explained above, the storage well 140 may have fewer or more than two doping levels.

The detector 100A also includes an in-pixel storage region, illustrated as storage node 115 (SN), which is pinned to a pinning layer 150A to define the maximum potential of the storage node 115. In operation, and as explained further below at least in the discussion of FIG. 3, signal charge accumulated during an exposure (integration period) is transferred from the storage well 140 to the in-pixel storage node 115, where it is held until it is read out.

Figure 2D:
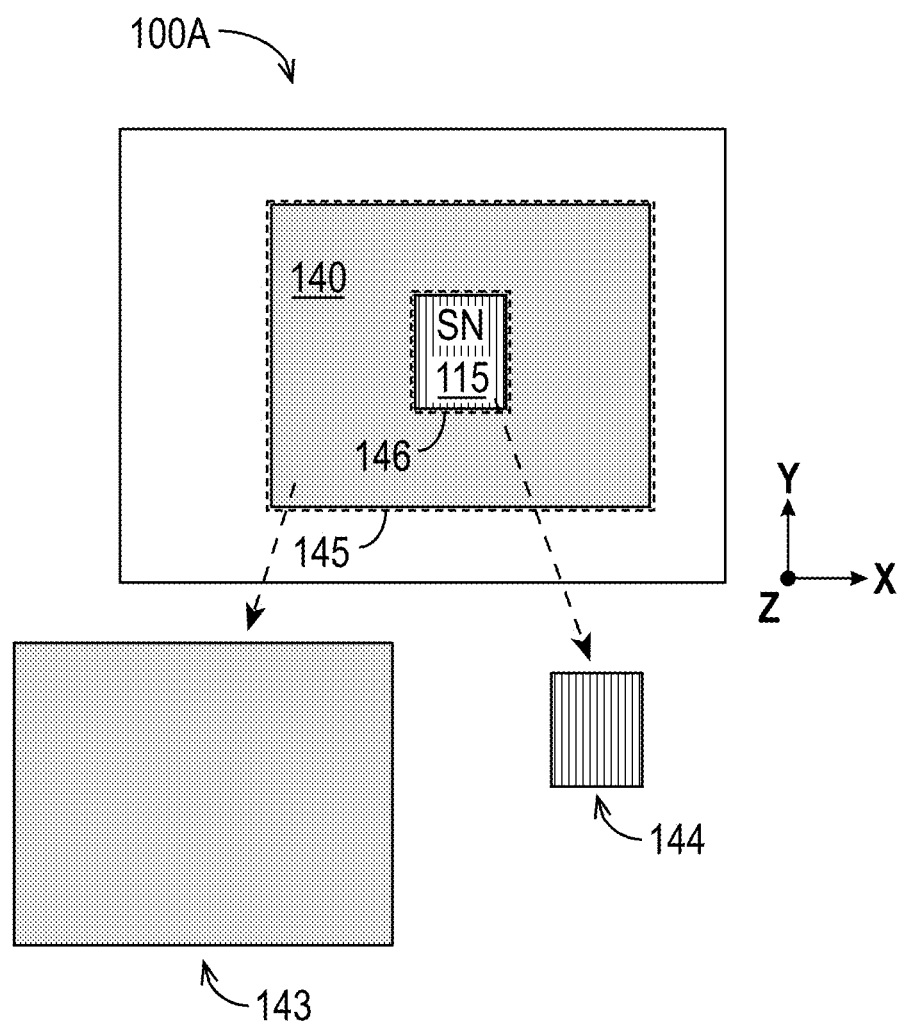
FIG. 2D illustrates the lateral area and lateral perimeter of the storage well as compared to the lateral area and lateral perimeter of the storage node in accordance with some embodiments.

As shown in FIGS. 2B and 2C, the storage well 140 is situated underneath the storage node 115, between the storage node 115 and the backside surface 190 (the light-incident surface). FIG. 2D illustrates the lateral area 143 and lateral perimeter 145 of the storage well 140 as compared to the lateral area 144 and lateral perimeter 146 of the storage node 115. As shown, the lateral area 143 of the storage well 140 is greater than or equal to the lateral area 144 of the storage node 115 (i.e., the rectangle labeled 144 is smaller than the rectangle labeled 143). Furthermore, no portion of the lateral perimeter 146 of the storage node 115 extends outside of the lateral perimeter 145 of the storage well 140. Thus, the storage well 140 blocks backside illumination of the storage node 115 and operates to shield the storage node 115 from signal charge at least for relatively short absorption-length visible light, without requiring supplemental (fill-factor-degrading) shielding structures. Also, as will be appreciated by those having ordinary skill in the art, the p-type region between the storage node 115 and the shallow region 141B (and the deep region 141A) may be maintained in an accumulation state to minimize the electrical cross-talk (charge sharing) between the regions (e.g., between the storage node 115 and the shallow region 141B). Thus, the detector 100A provides excellent electrical shielding of the storage node 115 without degrading the fill factor.

It is to be appreciated that a storage node 115 is one type of storage region that can be shielded by the storage well 140, as illustrated in FIGS. 2A-2D. As discussed and explained further below, a floating diffusion node 105 is another type of storage region that can be shielded by the storage well 140. In general, the structures and arrangements described herein can be used to shield any in-pixel storage region from unwanted backside illumination. The discussion herein of storage nodes 115 and floating diffusion nodes 105 as two types of in-pixel storage nodes that can be protected from backside illumination by the storage well 140 is not meant to be limiting. Thus, the term "storage region" is not limited to storage nodes 115 and floating diffusion nodes 105.

As shown in FIGS. 2A and 2C, the exemplary detector 100A also includes a transfer gate (TG) 120, which is formed on the frontside surface 195. The transfer gate 120 is configured to cause signal charge to transfer from the storage well 140 to the storage node 115 in response to a voltage applied to the transfer gate 120. Accordingly, the transfer gate 120 may be situated over at least a portion of the storage well 140, as shown in FIG. 2C.

As shown in FIGS. 2A and 2C, the exemplary detector 100A also includes a floating diffusion (FD) node 105, and, as shown in FIG. 2C, a pump gate structure 130 situated between the storage node 115 and the floating diffusion node 105. The floating diffusion node 105 is coupled to control and readout circuitry 235, which, in the illustrated example, includes three MOSFET transistors 230A, 230B, and 230C. The floating diffusion node 105 is coupled to the gate of a source-follower transistor 230A (SF) and to the source of a row-select (RS) transistor 230C to allow the signal charge in the floating diffusion node 105 to be read out. The floating diffusion node 105 is also coupled to the source of a reset transistor 230B that has a reset gate (RG). Before transferring signal charge to the floating diffusion node 105, the reset gate is selectively switched to reset the floating diffusion node 105 to a reference potential set by the drain of the reset transistor 230B. Conversion of the photo-charge to a voltage is determined by the capacitance of the floating diffusion node 105. FIG. 2C illustrates MOSFET transistors 230A, 230B, 230C. As explained below, other components may be used in addition or instead.

In the example embodiment of FIGS. 2A-2C, the pump gate structure 130 is horizontally situated and is configured to assist to transfer signal charge from the storage node 115 to the floating diffusion node 105 in response to a voltage (bias) applied to a signal gate (SG) 110 that is coupled to the pump gate structure 130. The exemplary pump gate structure 130 includes a plurality of doping regions, with three doping regions shown in FIG. 2C. Specifically, in the illustrated example, the pump gate structure 130 includes a virtual barrier (VB) region, a p-type barrier (PB) region, and a p-type well (PW) region situated between the virtual barrier region and the p-type barrier region. As shown, the p-type barrier region may be adjacent to the storage node 115, and the virtual barrier region may be adjacent to the floating diffusion node 105. In the exemplary embodiment of FIGS. 2A-2C, the signal gate 110 is formed on the frontside surface 195, and the pump gate structure 130 is horizontal and situated under the signal gate 110. The horizontal pump-gate structure 130 may be implemented underneath the signal gate 110 to reduce the overlap capacitance between signal gate 110 and the floating diffusion node 105, thereby increasing conversion gain.

Referring again to FIG. 1, the global-shutter image sensor 10A includes a global transfer gate (TG) 30, which is coupled to each row of the detector array. When the detectors 50A, 50B, etc. of the detector array are the exemplary detector 100A of FIGS. 2A-2C, the global transfer gate 30 may be connected or coupled, for example, to the transfer gate 120 shown in FIGS. 2A and 2C. In operation, a globally-synchronized pulse signal generated by the global transfer gate 30 may be applied to the transfer gate(s) 120 to transfer the signal charge from each detector 100A's storage well 140 to its respective in-pixel storage node 115. This operation occurs substantially simultaneously within all pixels of the pixel array (i.e., globally).

The global-shutter image sensor 10A includes, for each row, control and readout circuitry, labeled in FIG. 1 as 20A, 20B, 20C, 20D, 20E, 20F, 20G, and 20Z. That the last row of control and readout circuitry is labeled as 20Z is for convenience and not to imply that there are exactly 26 rows in the array of detectors. It is to be understood that the global-shutter image sensor apparatus 10A may have any number of rows (and the corresponding control and readout circuitry for each row) and any number of columns. As explained above, the array can be of any size or shape. The control and readout circuitry 20A, 20B, etc. is described in further detail below. In some embodiments, each instance of the control and readout circuitry 20A, 20B, etc. provides a reset signal (RG), a row select signal (RS), and a signal gate signal (SG).

After the global shuttering operation (e.g., after the integration period), signals corresponding to photo-charge stored within the detector 100A storage nodes 105 may be read out (e.g., sequentially, generally row-by-row with readout parallelism with respect to pixels in a given row, via column lines coupled to respective detectors 100A in the row). When the signal charge stored in a storage node 115 is read out of the detectors 100A, the charge is transferred to the floating diffusion node 105 by pulsing the signal gate 110. The pinned photodiode structure used to form the storage node 115 allows lag-free charge transfer from the storage node 115 to the floating diffusion node 105. Because the storage well 140 prevents incident light from reaching the photo-sensitive storage node 115, the disclosed configuration of the detector 100A helps to maintain the accuracy of the signal stored in the storage node 115.

The signals obtained from the detectors 50A, 50B, etc. may be subjected to analog signal processing 40 and/or digital signal processing 45 using any suitable techniques.

Figure 3:
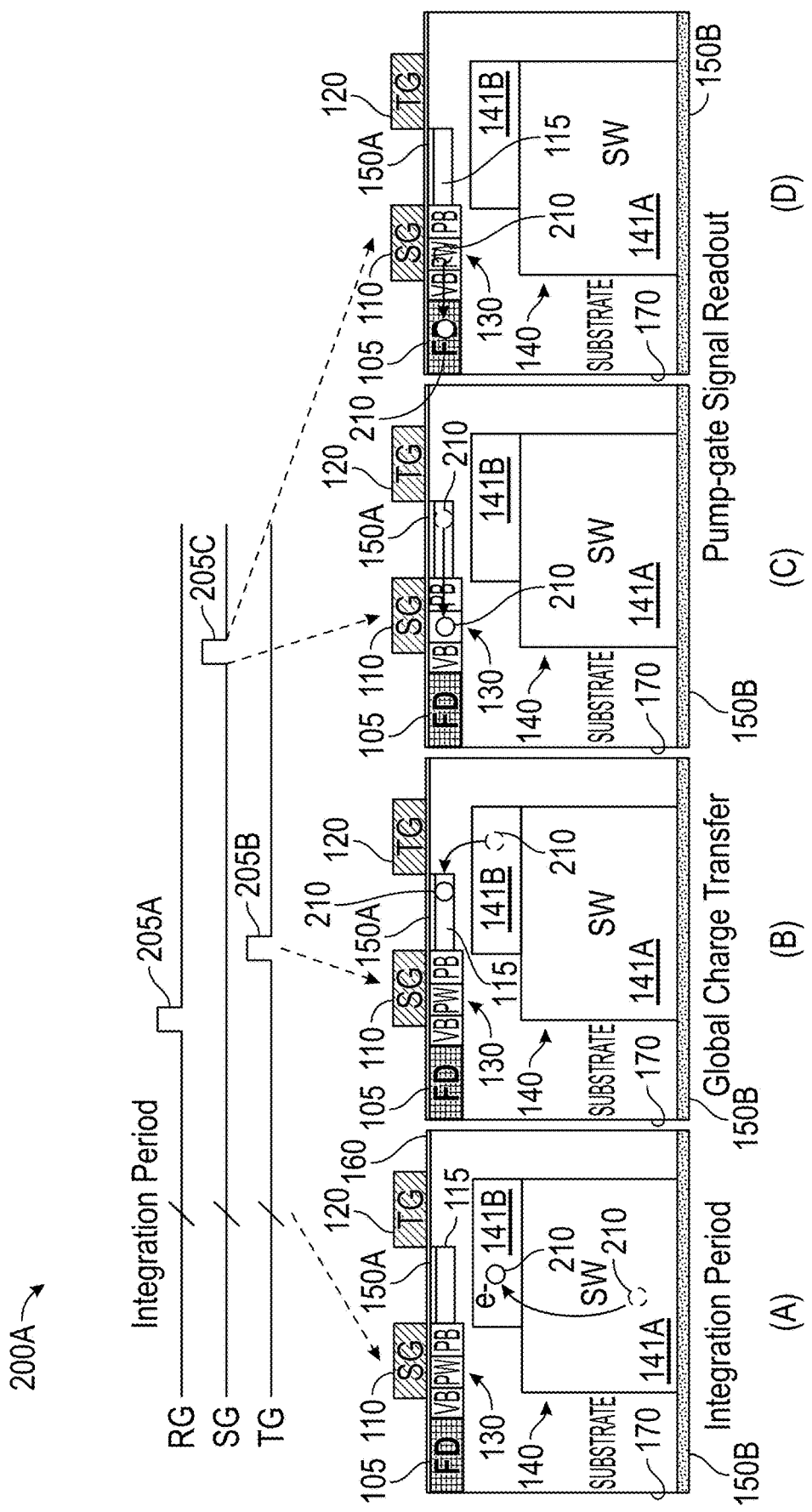
FIG. 3 is an operating timing and charge transfer diagram to illustrate operation of the exemplary detector illustrated in FIGS. 2A, 2B, 2C, and 2D.

FIG. 3 is an example operating timing and charge transfer diagram to illustrate operation of the exemplary detector 100A illustrated in FIGS. 2A, 2B, 2C, and 2D. As illustrated in FIG. 3, during the integration period (labeled (A)), signal charge 210 accumulates in the storage well 140. Initially, the charge 210 accumulates in the deep region 141A. Due to the difference in doping levels between the deep region 141A and the shallow region 141B, at least some of the signal charge 210 migrates from the deep region 141A to the shallow region 141B during the integration period in the exemplary detector 100A.

A reset gate (RG) pulse 205A may be asserted prior to the signal gate (SG) pulse 205C to reset the floating diffusion node(s) 105 to a known potential and to allow for correlated double sampling (e.g., to remove kTC reset noise in a pixel).

After the integration period, a pulse 205B is applied to the transfer gate 120 (labeled (B)). The pulse 205B causes the signal charge 210 in the storage well 140 to be transferred, vertically, to the storage node 115.

The signal charge 210 can be transferred to the floating diffusion node 105 via the pump gate structure 130 in two steps, as shown in the two right-most panels of FIG. 3

(labeled (C) and (D)). The pulse 205C on the signal gate 110 causes the signal charge 210 to transfer from the signal node 115 to the p-type well (PW) of the pump gate structure 130. When the pulse 205C ends, and the voltage on the signal gate 110 returns to the reference level (e.g., ground or a reference voltage), the signal charge 210 transfers from the p-type well (PW) of the pump gate structure 130 to the floating diffusion node 105. The signal charge 210 can then be read from the floating diffusion node 105.

Figure 4A:
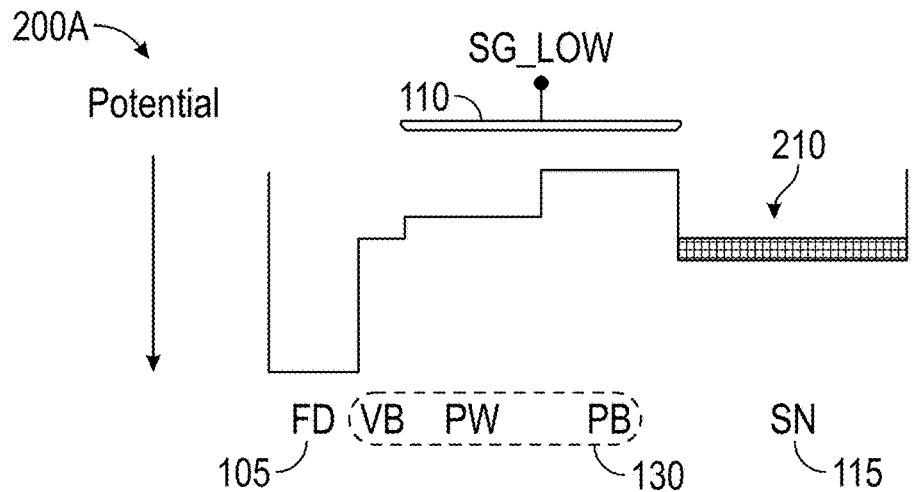
FIGS. 4A, 4B, and 4C illustrate charge transfer of a horizontal pump gate structure in accordance with some embodiments.
Figure 4B:
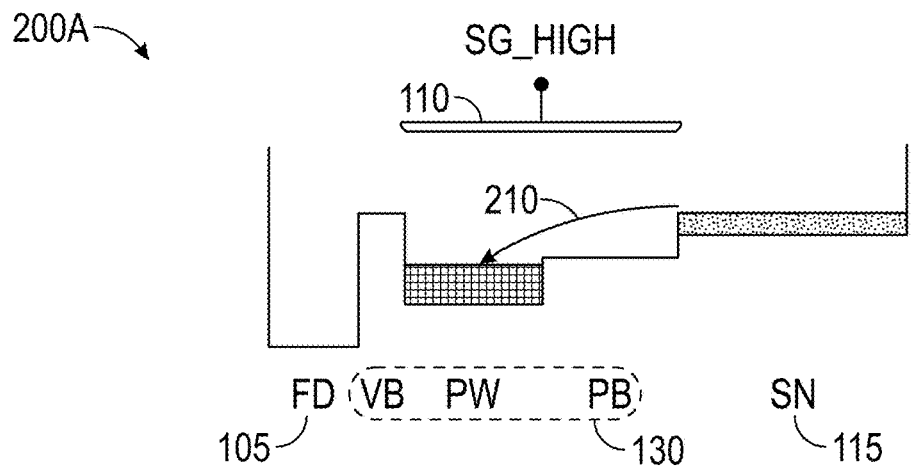
Figure 4C:
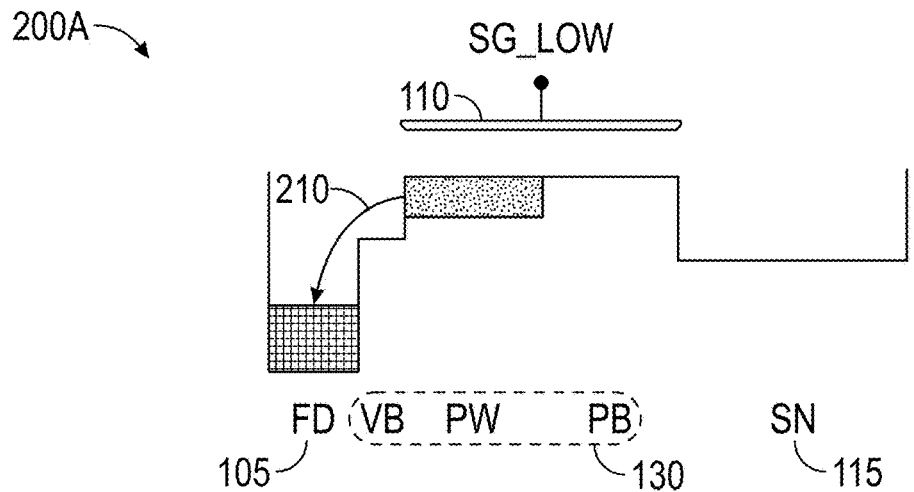

FIGS. 4A, 4B, and 4C show an exemplary charge transfer diagram 200A to illustrate the charge transfer from the storage node 115 to the floating diffusion node 105 via the horizontal pump gate structure 130 in accordance with some embodiments. As shown in FIG. 4A, when the signal gate 110 level is low (e.g., no bias voltage is applied), the signal charge 210 remains in the storage node 115. As shown in FIG. 4B, when the signal gate 110 is positively biased, the electric field causes the signal charge 210 to drift to the p-type well (PW) region of the pump gate structure 130. As shown in FIG. 4C, when the signal gate 110 bias voltage returns to the "off" state, the signal charge 210 flows to the floating diffusion node 105 through the virtual barrier (VB) region of the pump gate structure 130. This approach yields high conversion gain due at least in part to reduction or elimination of the signal gate 110 parasitic capacitance from the effective gain expression (signal gate 110 parasitic capacitance does not factor into the source/destination capacitance ratio).

FIGS. 5A, 5B, and 5C illustrate alternative embodiments of the transfer gate 120 structure in accordance with some embodiments. Other elements shown in FIGS. 5A-5C were described above. Those descriptions apply to FIGS. 5A-5C and are not repeated.

FIG. 5A illustrates a layout of an exemplary detector 100B in accordance with some embodiments. In the example plan view of FIG. 5A, the transfer gate 120 extends laterally (in the x-y plane) around the storage node 115. FIG. 5B illustrates a layout of another exemplary detector 100C in accordance with some embodiments. In the example plan view of FIG. 5B, the transfer gate 120 extends laterally around both the storage node 115 and the signal gate 110. FIG. 5C is a cross-sectional view applicable to both of the exemplary detectors 100B and 100C illustrated in FIGS. 5A and 5B. As shown the transfer gate 120 resides over the storage well 140. As a consequence, when a bias voltage is applied to the transfer gate 120 to cause the signal charge 210 in the storage well 140 to transfer to the storage node 115, the transfer gate 120 provides a more direct path. In other words, because the storage well 140 is underneath the storage node 115, the extension of the transfer gate 120 toward the floating diffusion node 105 assists the signal charge 210 transfer.

Figure 6A:
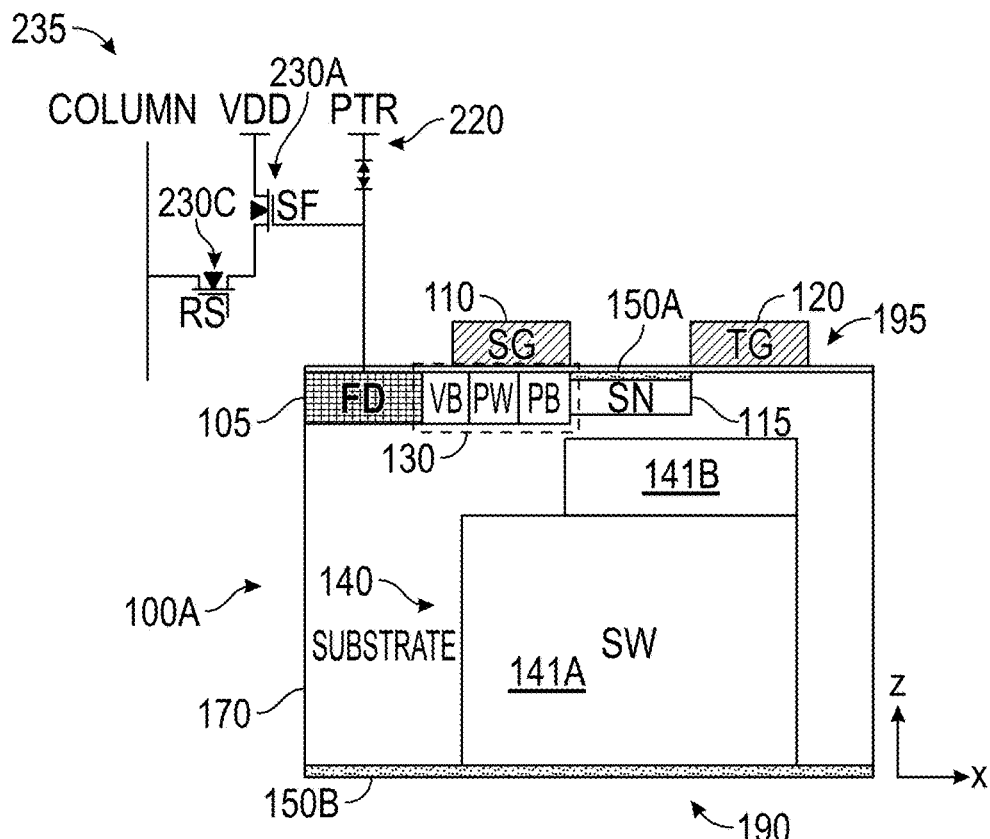
FIG. 6A illustrates a cross-sectional view of an exemplary detector with exemplary control and readout circuitry that includes a punch-through reset diode in accordance with some embodiments.
Figure 6B:
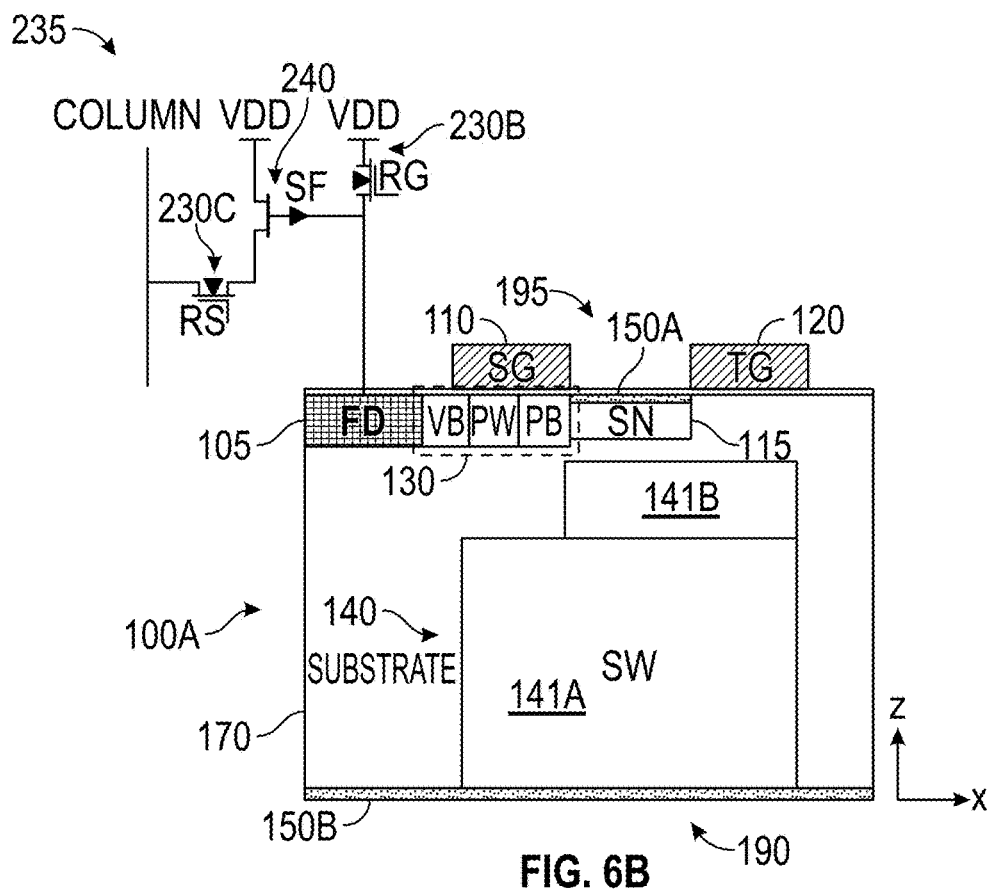
FIG. 6B illustrates a cross-sectional view of an exemplary detector with exemplary control and readout circuitry that includes a JFET source-follower in accordance with some embodiments.
Figure 6C:
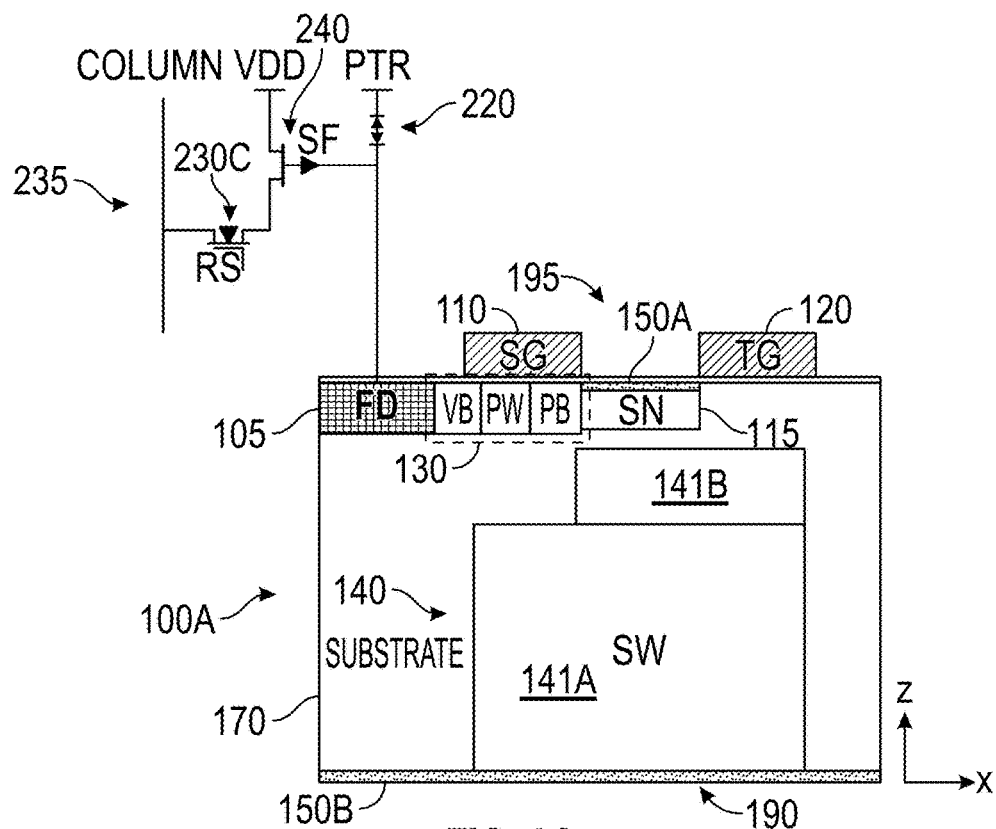
FIG. 6C illustrates a cross-sectional view of an exemplary detector with exemplary control and readout circuitry that includes a JFET source-follower and punch-through reset diode in accordance with some embodiments.

As described above, each of the embodiments described herein may also contain a reset transistor 230B, a source-follower 230A, and a row selection transistor 230C. FIGS. 6A, 6B, and 6C show alternative control and readout circuitry 235 in accordance with some embodiments. Other elements shown in FIGS. 6A-6C were described above. Those descriptions apply to FIGS. 6A-6C and are not repeated. Although FIGS. 6A-6C illustrate the exemplary detector 100A, it is to be appreciated that the disclosures are applicable to other exemplary detectors (e.g., 100B, 100C).

FIG. 6A illustrates a cross-sectional view of an exemplary detector 100A with exemplary control and readout circuitry 235 in which the reset transistor 230B is replaced by a punch-through reset diode 220 in accordance with some embodiments. The punch-through reset diode 220 may provide a higher conversion gain than the reset transistor 230B.

FIG. 6B illustrates a cross-sectional view of an exemplary detector 100A with exemplary control and readout circuitry 235 in which the MOSFET source-follower 230A is replaced by a JFET source-follower 240 in accordance with some embodiments. The JFET source-follower 240 may provide higher conversion gain and lower voltage noise than a MOSFET source-follower 230A.

FIG. 6C illustrates a cross-sectional view of an exemplary detector with exemplary control and readout circuitry 235 in which the reset transistor 230B is replaced by a punch-through reset diode 220, and the MOSFET source-follower 230A is replaced by a JFET source-follower 240 in accordance with some embodiments. This configuration may provide higher conversion gain and lower voltage noise.

Figure 7A:
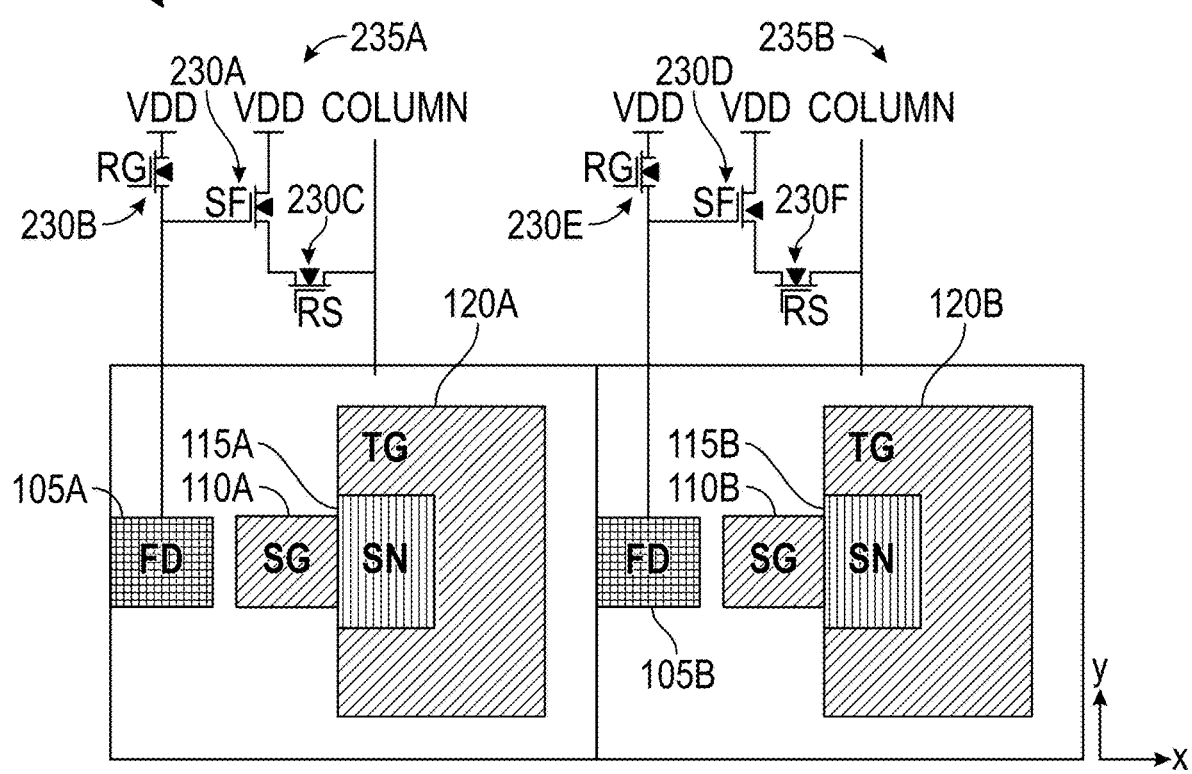
FIG. 7A illustrates an exemplary layout for an exemplary image sensor with a non-shared readout in accordance with some embodiments.

FIGS. 7A-7D illustrate exemplary global-shutter pump-gate detector layouts in accordance with some embodiments. FIG. 7A illustrates an exemplary layout (plan view, x-y plane) for an exemplary image sensor apparatus 300A in which each detector (shown as the detector 100B of FIG. 5A) has dedicated (e.g., non-shared) control and readout circuitry 235 in accordance with some embodiments. As illustrated, the exemplary image sensor apparatus 300A includes a first detector that has a floating diffusion node 105A, signal gate 110A, storage node 115A, and transfer gate 120A. The floating diffusion node 105A is coupled to a first instance control and readout circuitry 235A that includes a reset gate transistor 230B, a source-follower transistor 230A, and a row select transistor 230C. Likewise, the exemplary image sensor apparatus 300A includes a second detector that has a floating diffusion node 105B, signal gate 110B, storage node 115B, and transfer gate 120B. The floating diffusion node 105B is coupled to a second instance of control and readout circuitry 235B that includes a reset gate transistor 230E, a source-follower transistor 230D, and a row select transistor 230F. Thus, each detector has dedicated control and read-out circuitry 235.

Figure 7B:
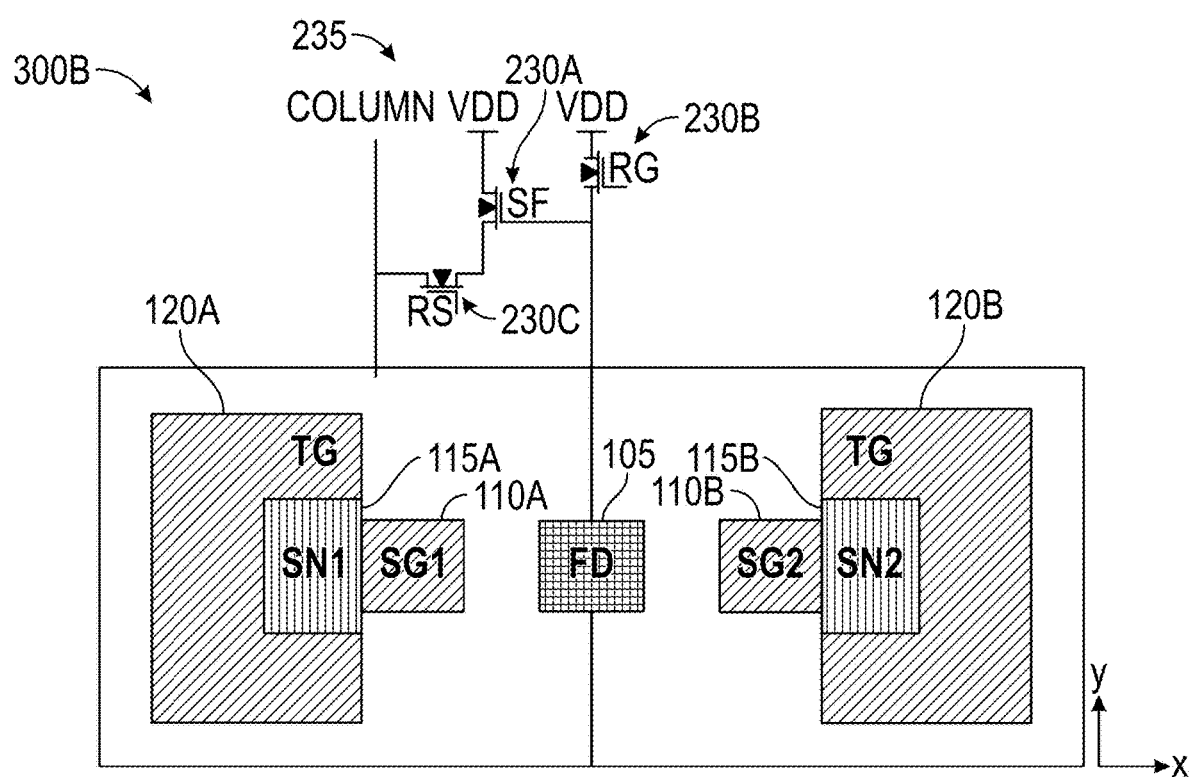
FIG. 7B illustrates an exemplary layout for an exemplary image sensor with two-way shared control and readout circuitry in accordance with some embodiments.

FIG. 7B illustrates an exemplary layout (plan view, x-y plane) for an exemplary image sensor apparatus 300B in which two detectors (each shown as the detector 100B of FIG. 5A) share control and readout circuitry 235 in accordance with some embodiments. In the illustrated example, two detectors share a single floating diffusion node 105. The transfer gates 120A and 120B operate as discussed above (e.g., in the discussion of FIGS. 2A-2C), and that discussion is not repeated here. Although not shown in the plan view, each detector can also include a pump gate structure 130 situated between the storage node 115 and the floating diffusion node 105, below the signal gate 110 (e.g., as illustrated in and discussed in the context of FIG. 2C, among others). To transfer the signal charge from the storage node 115A to the floating diffusion node 105, a bias voltage is applied to the signal gate 110A (e.g., as described in the discussion of FIG. 3) while the signal gate 110B is held low. Conversely, to transfer the signal charge from the storage node 115B to the floating diffusion node 105, a bias voltage is applied to the signal gate 110B (e.g., as described in the discussion of FIG. 3) while the signal gate 110A is held low. The potential of the floating diffusion node 105 can be reset before applying the second signal gate pulse (in the sequence described above, before applying the bias voltage to the signal gate 110B), as described in the discussion of FIG. 3.

FIG. 7C illustrates an exemplary layout (plan view, x-y plane) for an exemplary image sensor apparatus 300C in which four detectors (each shown as the detector 100B of FIG. 5A) share control and readout circuitry 235 in accordance with some embodiments. As shown, in this example, two layouts as described above in the context of FIG. 7B are combined, and the two floating diffusion nodes 105A, 105B are coupled together via the element 106, which may be, for example, a metal route that electrically connects the two floating diffusion nodes 105A, 105B. The transfer gates 120A, 120B, 120C, and 120D operate as discussed above (e.g., in the discussion of FIGS. 2A-2C), and that discussion is not repeated here. Also, although not shown in the plan view, each detector can also include a pump gate structure 130 situated between its storage node 115 and the floating diffusion node 105, below its signal gate 110 (e.g., as illustrated in and discussed in the context of FIG. 2C, among others). A single instance of control and readout circuitry 235 is coupled to the floating diffusion nodes 105A, 105B. To transfer the signal charge from a selected storage node (e.g., one of 115A, 115B, 115C, 115D) to the coupled floating diffusion nodes 105A, 105B, a bias voltage is applied to the selected signal gate 110 (e.g., as described in the discussion of FIG. 3) while the remaining signal gates 110 are held low. For example, to read the signal charge in the storage node 115B, a bias voltage is applied to the signal gate 110B, but not any of the signal gates 110A, 110C, or 110D. Before (or after) applying a bias voltage to the selected signal gate 110, the potential of the floating diffusion nodes 105A, 105B can be reset as described in the discussion of FIG. 3.

FIG. 7D illustrates an exemplary layout (plan view, x-y plane) for an exemplary image sensor 300D with four-way shared control and readout circuitry 235 in accordance with some embodiments. The example of FIG. 7D may use wafer-level stacking. Such embodiments may be referred to as stacked BSI image sensors. In a stacked BSI image sensor, the light sensitive elements of the pixel array are formed in a first semiconductor die or substrate, and associated control and readout circuitry 235 for processing signals from the photodiodes is formed in a second semiconductor die or substrate that, following assembly, directly overlies the first semiconductor die or substrate. A stacked BSI image sensor may be fabricated, for example, by forming the first and second semiconductor die alongside many other like die on first and second semiconductor wafers, and then stacking the two wafers. After aligning inter-wafer electrical interconnects, the stacked wafers may be diced into chips, each of which forms a stacked image sensor. A stacked arrangement can reduce the footprint of the resulting image sensor as compared to alternative, non-stacked arrangements. In addition, independent optimizations may be used for the different die.

As shown in FIG. 7D, in this example, a single floating diffusion node 105 and a single instance of control and readout circuitry 235 are shared by four detectors. Although the orientations and plan-view shapes of the transfer gates 120, storage nodes 115, and signal gates 110 differ from those shown in FIG. 7C, they operate in the same manner as described for the detectors shown in FIG. 7C. That discussion is not repeated here.

Figure 8:
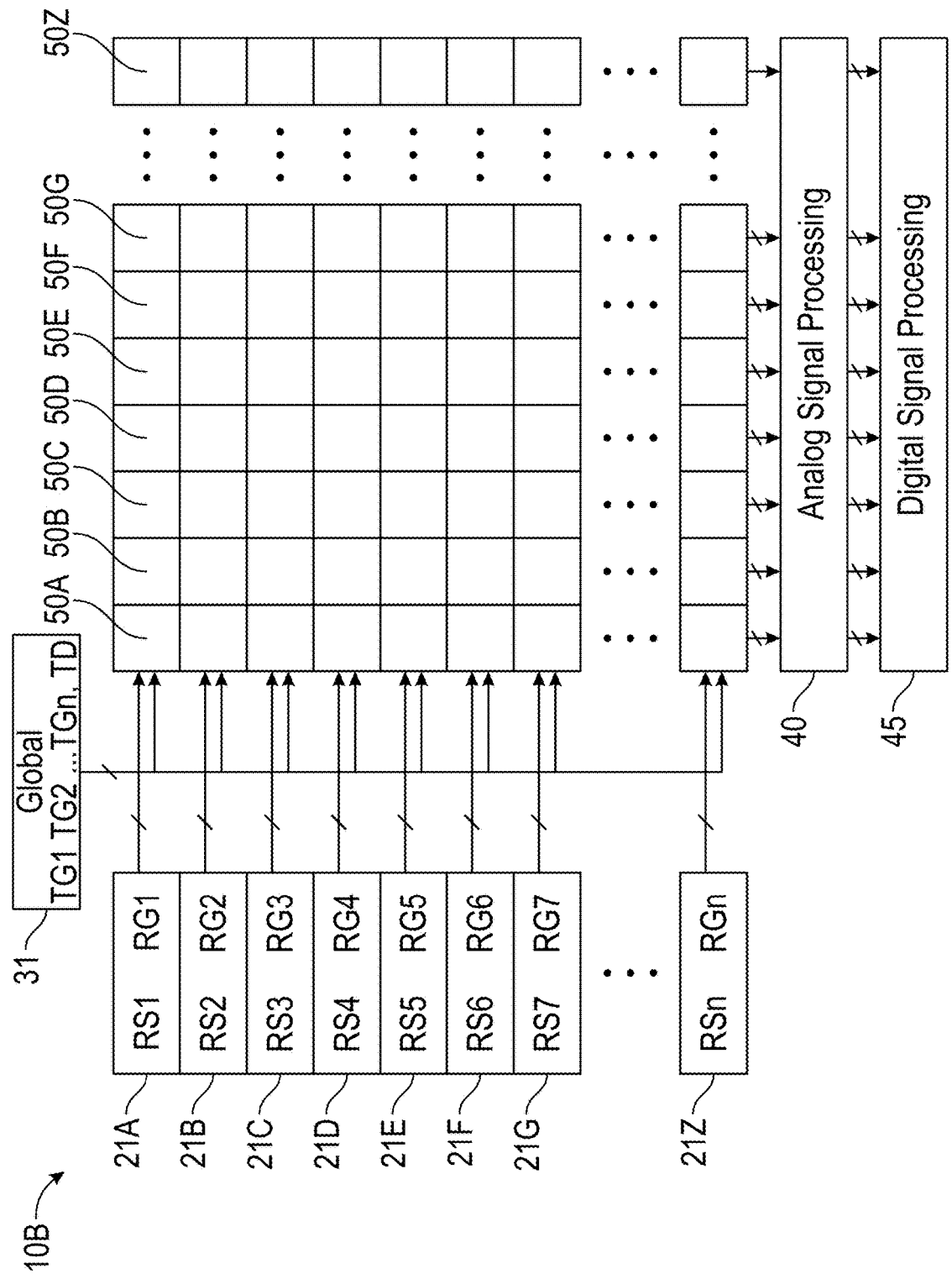
FIG. 8 is an illustration of an exemplary multi-tap time-resolved sensor without in-pixel storage nodes in accordance with some embodiments.

The global-shutter image sensor apparatus described above can also be modified to be a time-gated detector for time-resolved applications, such as for time-of-flight, fluorescence lifetime imaging (FLIM), etc. FIG. 8 illustrates an exemplary multi-tap time-resolved sensor 10B without in-pixel storage nodes in accordance with some embodiments. Like the exemplary global-shutter image sensor apparatus 10A shown in FIG. 1, the exemplary multi-tap time-resolved sensor 10B includes an array of detectors, eight of which are labeled in FIG. 8 as 50A, 50B, 50C, 50D, 50E, 50F, 50G, and 50Z. The array of detectors can be of any suitable size. That the last detector in the first row is labeled as 50Z is for convenience and not to imply that there are exactly 26 detectors in each row of the array. It is to be understood that the global-shutter image sensor apparatus 10B may have any number of detectors 50A, 50B, etc. and, accordingly, any number of rows and any number of columns. The array can be of any size or shape.

In time-gated applications, the high-resolution temporal profile of a periodic light source may be captured by periodically transferring the signal charge in the storage well(s) 140 to multiple readout channels with a fast-switching steering system. Normally, the signal from multiple illumination cycles will be integrated in the readout channels before readout. A vertical storage well 140 and pump-gate 130 can be applied to the pixels in these sensors to achieve a higher fill-factor, higher conversion gain, lower read noise, and smaller area size.

Figures 9A, 9B:
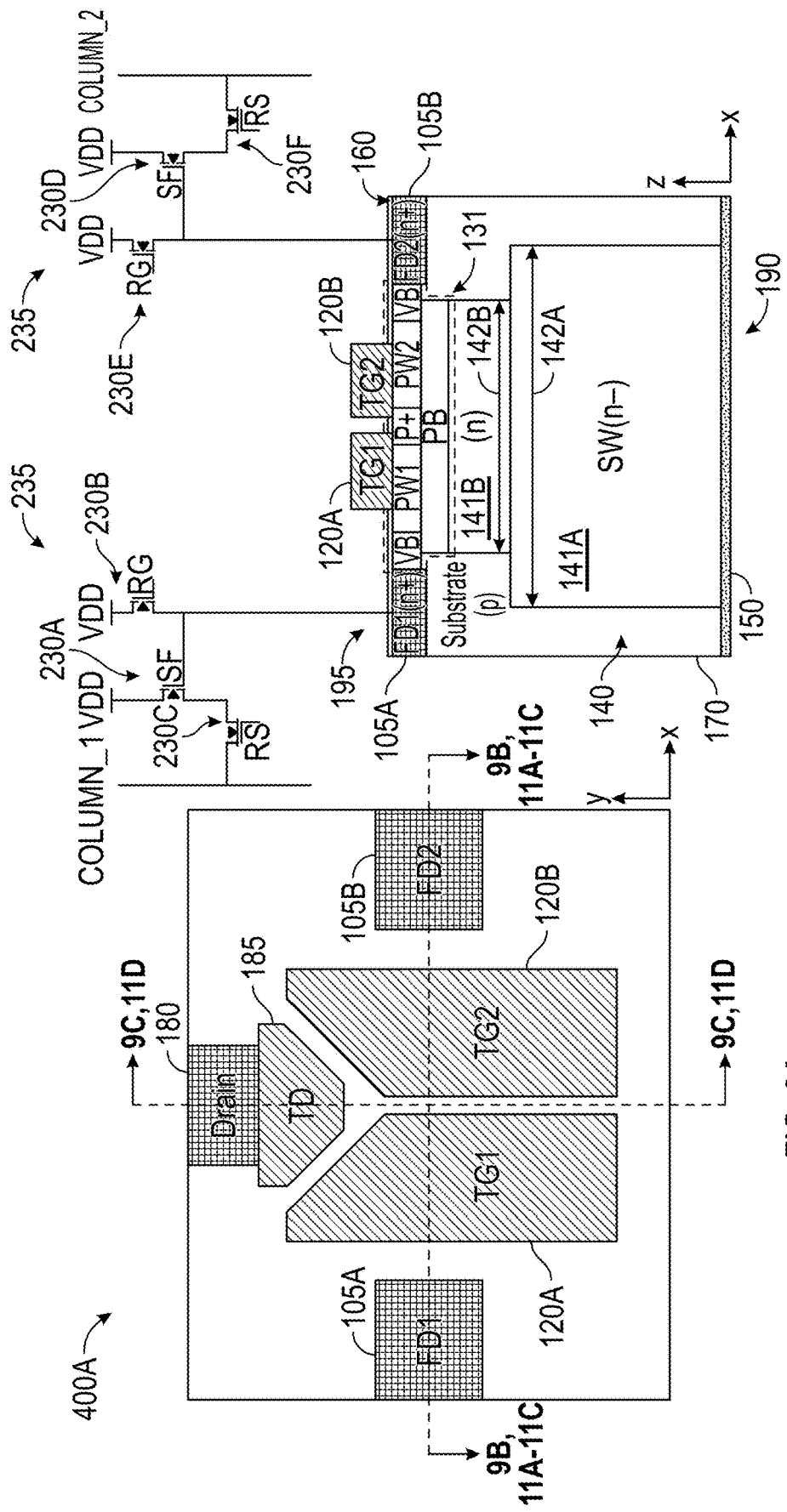
FIG. 9A illustrates an exemplary layout of an exemplary two-tap detector in accordance with some embodiments.
FIG. 9B illustrates a cross-sectional view of the exemplary detector of FIG. 9A with exemplary control and readout circuitry in accordance with some embodiments.
Figure 9C:
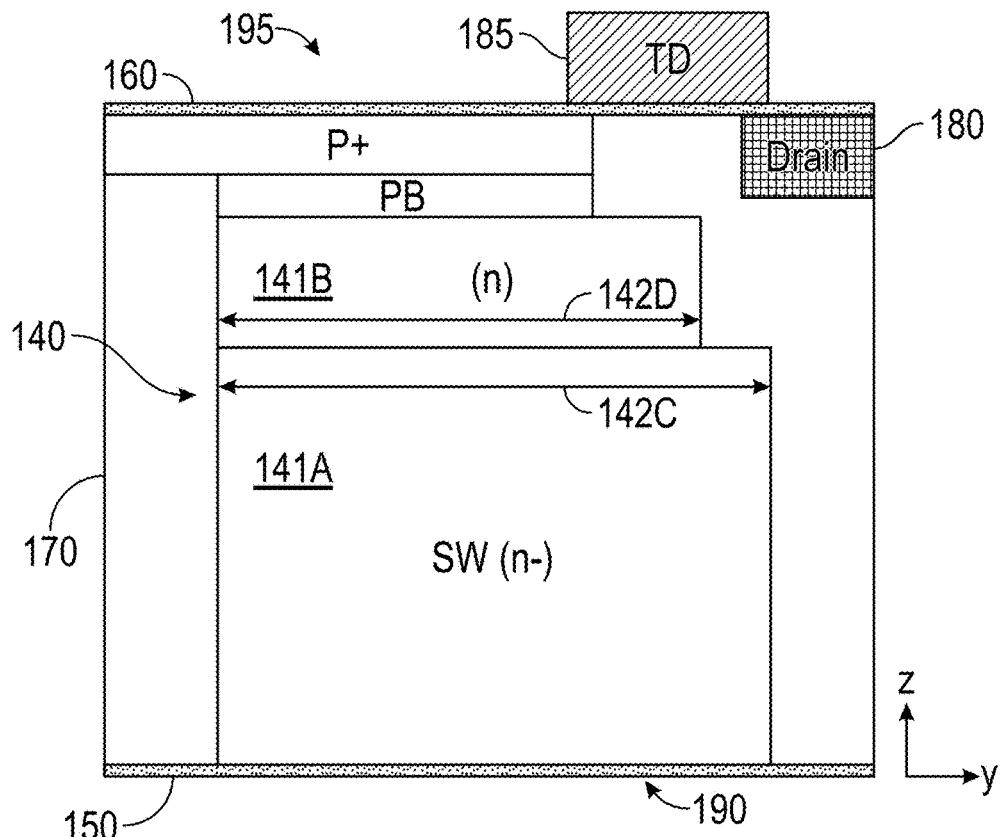
FIG. 9C illustrates a cross-sectional view of the exemplary detector of FIG. 9A in accordance with some embodiments.

FIGS. 9A, 9B, and 9C illustrate an exemplary two-tap detector 400A in accordance with some embodiments. The detector 400A may be used, for example, to implement pairs of detectors (50A and 50B, etc.) in the exemplary multi-tap time-resolved sensor 10B shown in FIG. 8. FIG. 9A illustrates an exemplary layout (plan view, x-y plane) of the exemplary two-tap detector in accordance with some embodiments. As shown, the detector 400A includes dedicated floating diffusion nodes 105A and 105B, dedicated transfer gates 120A and 120B, a shared transfer drain (TD) gate 185, and a shared drain 180. The transfer gates 120A, 120B and floating diffusion nodes 105A, 105B are similar to those previously described; those descriptions apply here and are not repeated.

FIG. 9B illustrates a cross-sectional view of the exemplary detector 400A at the location indicated in FIG. 9A with exemplary control and readout circuitry 235 in accordance with some embodiments. As shown, the detector 400A is formed on/in a substrate 170, and it has a backside surface 190 and a frontside surface 195. In the illustrated example, the frontside surface 195 includes a layer of protective material 160, which may be, for example, an oxide. Like previously-described detectors, the detector 400A includes a pinned storage well (SW) 140 in which signal charge is accumulated during the integration period. A pinning layer 150B is adjacent to the storage well 140 at or near the backside surface 190 to define the maximum potential of the storage well 140.

As shown in FIG. 9B, the exemplary detector 400A also includes a first floating diffusion (FD1) node 105A and a second floating diffusion (FD2) node 105B. The floating diffusion node 105A is coupled to the gate of a source-follower (SF) transistor 230A and to the source of a row-select (RS) transistor 230C, which allow the signal charge in the floating diffusion node 105A to be read out. The floating diffusion node 105A is also coupled to the source of a reset transistor 230B that has a reset gate (RG) that, before transferring signal charge to the floating diffusion node 105A, is selectively switched to reset the floating diffusion node 105A to a reference potential set by the drain of the reset transistor 230B. Similarly, the floating diffusion node 105B is coupled to the gate of a source-follower (SF) transistor 230D and to the source of a row-select (RS) transistor 230F, which allow the signal charge in the floating diffusion node 105B to be read out. The floating diffusion node 105B is also coupled to the source of a reset transistor 230E that has a reset gate (RG) that, before transferring signal charge to the floating diffusion node 105B, is selectively switched to reset the floating diffusion node 105B to a reference potential set by the drain of the reset transistor 230E. FIG. 9B illustrates MOSFET transistors 230A, 230B, 230C, 230D, 230E, and 230F, but it is to be appreciated that, as explained above, other components (e.g., punch-through diodes, JFET transistors) may be substituted for or used in addition to certain of these components.

Unlike previously-described detectors, the detector 400A does not include an in-pixel storage node or any signal gates. Instead, it includes only a pump gate structure 131 that is configured to assist to transfer signal charge from the storage well 140 to one of the floating diffusion nodes 105A, 105B in response to a voltage applied to the corresponding transfer gate (TG) 120A, 120B. As shown in FIG. 9B, the pump gate structure 131 includes a p-type barrier layer (labeled PB) adjacent to the shallow region 141B of the storage well 140 and underlying the rest of the pump gate structure 131, namely a first virtual barrier (VB) adjacent to the floating diffusion node 105A, a first p-type well region (PW1) adjacent to the first virtual barrier, a second virtual barrier (VB) adjacent to the floating diffusion node 105B, a second p-type well region (PW2) adjacent to the second virtual barrier, and a p-type region (P+) situated between the first and second p-type well regions. The pump gate structure 131 may be referred to as a vertical pump gate structure because the p-type barrier region (PB) is situated underneath the rest of the pump gate structure 131. The vertical pump-gate structure 131 may be implemented underneath the transfer gates 120A, 120B to reduce the overlap capacitance between transfer gates 120A, 120B and their respective floating diffusion nodes 105A, 105B, thereby increasing conversion gain.

FIG. 9C illustrates a cross-sectional view of the exemplary detector 400A at the location shown in FIG. 9A in accordance with some embodiments. As shown in FIG. 9C, the detector 400A includes a transfer drain (TD) gate 185 and a drain 180. As explained further below in the discussion of FIG. 10, between illumination (exposure) cycles, the transfer drain gate 185 may be positively biased to steer redundant signal charge from the storage well 140 to the drain 180.

Similarly to other detectors previously described, the storage well 140 of the example detector 400A shown in FIGS. 9A-9C includes a deep region 141A and a shallow region 141B as described above (e.g., in the discussion of FIGS. 2A-2C). Those descriptions are not repeated here. It is noted, however, that once again the lateral dimensions of the deep region 141A and the shallow region 141B may be the same or different in various directions. For example, as shown in the example of FIG. 9B, the lateral dimension 142A of the deep region 141A in the x-direction is larger than the lateral dimension 142B of the shallow region 141B in the x-direction. Similarly, as shown in the example of FIG. 9C, the lateral dimension 142C of the deep region 141A in the y-direction is larger than the lateral dimension 142D of the shallow region 141B in the y-direction.

It is to be noted again that although FIGS. 9B and 9C illustrate the storage well 140 as if it has well-defined and linear boundaries, the storage well 140 may be formed using a semiconductor doping procedure. Accordingly, in some embodiments, the extent, size, and shape of the storage well 140 in an implementation may not be as well-defined or neat as FIGS. 9B and 9C suggest. Similarly, as explained above, in general, the storage well 140 may have fewer or more than two doping levels, it may have a doping gradient (whether substantially step-wise or more continuous), etc.

Figure 9D:
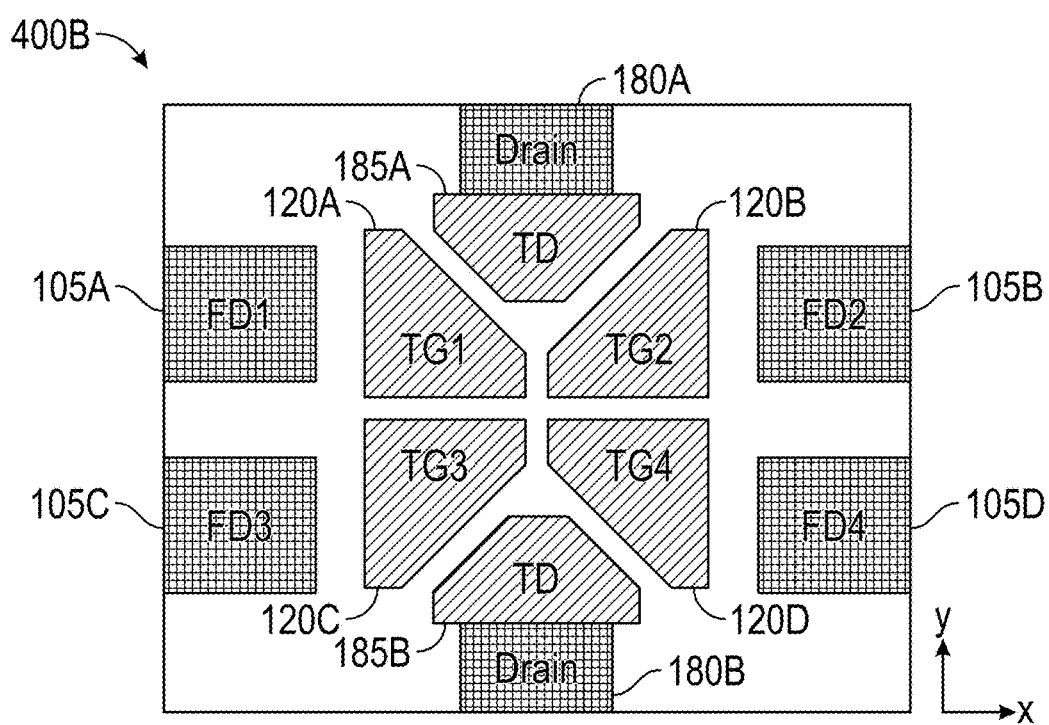
FIG. 9D illustrates an exemplary layout for an exemplary 4-tap detector in accordance with some embodiments.

FIGS. 9A-9C illustrate an exemplary two-tap time-gated sensor. The architecture may be expanded to increase the number of taps. For example, FIG. 9D illustrates an exemplary layout for an exemplary four-tap detector 400B in accordance with some embodiments. The exemplary four-tap detector 400B includes four transfer gates 120A, 120B, 120C, and 120D, and four respective floating diffusion nodes 105A, 105B, 105C, and 105D. In addition, it includes two transfer drain gates 185A, 185B and two drains 180A, 180B. Although not illustrated in FIG. 9D, the storage well 140 is situated underneath the transfer gates 120A, 120B, 120C, and 120D.

Whether in a two-tap (FIGS. 9A-9C) or four-tap (FIG. 9D) configuration, because multiple transfer gates 120 are situated above the storage well 140, the signal charge in the storage well 140 can be directed to a selected floating diffusion node 105 by biasing the corresponding transfer gate 120. During the integration period, the transfer gates 120 are pulsed sequentially to steer the signal charge to different directions. The placement of the vertical pump gate structure 131 underneath each transfer gate 120 (as described in the discussion of FIGS. 9A-9C) can reduce or eliminate the parasitic capacitance. While waiting for the next illumination cycle, the transfer drain gates 185 can be positively biased, which steers the redundant signal charge generated in this phase to the drains 180A, 180B.

FIG. 10 is an exemplary control signal timing diagram for a multi-tap detector (e.g., 400A, 400B) in accordance with some embodiments. In operation, signal charge accumulated during an exposure cycle is transferred from the storage well 140 to a selected floating diffusion node 105 via a pulse applied to the corresponding transfer gate 120, as illustrated in FIG. 10. An emitted light pulse 207A occurs at a first time. During the integration period, pulses are applied in sequence to the transfer gates 120 to steer signal charge to selected floating diffusion nodes 105. For example, as shown in FIG. 10, a first pulse 205A is applied to a first transfer gate (TG1), which will cause signal charge to be transferred from the storage well 140 to the floating diffusion node 105 controlled by the first transfer gate; then at a later time, a second pulse 205B is applied to a second transfer gate (TG2), which will cause signal charge to be transferred from the storage well 140 to the floating diffusion node 105 controlled by the second transfer gate; etc. After the last pulse 205N has been applied to the last transfer gate (TGn), while waiting for the next illumination cycle, the transfer drain gate(s) 185 is (are) positively biased (206A) to direct redundant signal charge to the drain(s) 180. The cycle begins again with another emitted light pulse 207B, after which additional pulses (205Z, etc.) are applied sequentially to the transfer gates to transfer signal charge from the storage well 140 to the floating diffusion nodes 105 controlled by the transfer gates. During the read-out portion of the cycle, another pulse (206B) is applied to the transfer drain gate(s) 185 to direct excess signal charge to the drain(s) 180.

Referring again to FIG. 8, as compared to the exemplary global-shutter image sensor apparatus 10A shown in FIG. 1, instead of having only a global transfer gate 30 coupled to each row of the detector array, the exemplary multi-tap time-resolved sensor 10B includes global transfer gate and transfer drain circuitry 31 coupled to each row of the detector array. When the detectors 50A, 50B, etc. of the detector array of FIG. 8 are the exemplary detector 400A or 400B, the global transfer gate and transfer drain circuitry 31 may be connected or coupled, for example, to each of the transfer gates 120 and transfer drain gate(s) 185 shown in FIGS. 9A-9D. In operation, periodic pulse signals generated by the global transfer gate and transfer drain circuitry 31 may be applied to selected transfer gate(s) 120 of detectors 400A (or 400B) in a row of the detector array to transfer the signal charge from each detector's storage well 140 to the floating diffusion node(s) 105 associated with the selected transfer gate(s) 120. For a selected set of transfer gates 120, this operation occurs substantially simultaneously within all detectors of the pixel array (i.e., globally). In addition, the global transfer gate and transfer drain circuitry 31 generates and applies global transfer drain pulse signals 205 to the transfer drain gates 185 of all of the detectors 50 in the array. The global transfer drain pulse signals are applied substantially simultaneously to all detectors 50 of the pixel array (i.e., globally).

The exemplary multi-tap time-resolved sensor 10B also includes, for each row, control and readout circuitry, labeled in FIG. 8 as 21A, 21B, 21C, 21D, 21E, 21F, 21G, and 21Z. That the last row of control and readout circuitry is labeled as 21Z is for convenience and not to imply that there are exactly 26 rows in the array of detectors. It is to be understood that the exemplary multi-tap time-resolved sensor 10B may have any number of rows (and the corresponding control and read-out circuitry for each row) and any number of columns. Each instance of the control and readout circuitry 21A, 21B, etc. provides a reset signal (RG) and a row select signal (RS).

After the integration period, signals may be read out (e.g., sequentially, generally row-by-row with read-out parallelism with respect to pixels in a given row, via column lines coupled to respective detectors (e.g., 50A, 50B, etc.) in the row). As described above, the signals obtained from the detectors 50A, 50B, etc. may be subjected to analog signal processing 40 and/or digital signal processing 45 using any suitable techniques.

As explained further below, with the vertical pump gate structure 131 included in the detector 400A, the signal charge in the storage well 140 can be transferred to a selected floating diffusion node 105 in two steps. The signal charge flows to the p-type well region underneath the transfer gate 120 when the transfer gate 120 is positively biased, and the charge flows from the p-type well region to the floating diffusion node 105 associated with the transfer gate 120 when the bias of the transfer gate 120 returns to the "off" voltage.

FIGS. 11A, 11B, 11C, 11D, 11E, and 11F illustrate how charge can be transferred within the exemplary detector 400A illustrated in FIGS. 9A-9C in accordance with some embodiments. As illustrated in FIG. 11A, during the integration period, signal charge 210 accumulates in the storage well 140. Initially, the charge 210 accumulates in the deep region 141A. Due to the difference in doping levels between the deep region 141A and the shallow region 141B in the example embodiment of the detector 400A, at least some of the signal charge 210 migrates from the deep region 141A to the shallow region 141B during the integration period.

After the integration period, a pulse is applied to the transfer gate 120A, as shown in FIG. 11B. The positive bias causes the signal charge 210 in the storage well 140 to be transferred, vertically, through the p-type barrier (PB) to the first p-type well (labeled PW1) of the vertical pump gate structure 131. When the pulse on the transfer gate 120A ends, and the voltage on the transfer gate 120A returns to the reference level (e.g., ground or a reference voltage), the signal charge 210 transfers to the floating diffusion node 105A via the virtual barrier (VB) adjacent to the first p-type well, as shown in FIG. 11C. The signal charge 210 can then be read from the floating diffusion node 105A.

The signal charge 210 can be transferred to the floating diffusion node 105B in a similar manner, as illustrated in FIGS. 11D and 11E. As shown in FIG. 11D, a pulse is applied to the transfer gate 120B, which causes the signal charge 210 in the storage well 140 to be transferred, vertically, through the p-type barrier (PB) to the second p-type well (labeled PW2) of the vertical pump gate structure 131. When the pulse on the transfer gate 120B ends, and the voltage on the transfer gate 120B returns to the reference level (e.g., ground or a reference voltage), the signal charge 210 transfers to the floating diffusion node 105B via the virtual barrier (VB) adjacent to the second p-type well, as shown in FIG. 11E. The signal charge 210 can then be read from the floating diffusion node 105B.

As shown in FIG. 11F, applying a bias voltage (e.g., pulse) to the transfer drain gate 185 causes residual or excess charge in the storage well 140 to transfer to the drain 180.

The transfer drain gate 185 and the drain 180 can be replaced by a punch-through reset (PTR) drain 181, as shown in the exemplary detector 400C illustrated in FIGS. 12A, 12B, and 12C. FIG. 12A illustrates an exemplary layout (plan view, x-y plane) for the exemplary multi-tap detector 400C with a PTR drain 181 in accordance with some embodiments, and FIGS. 12B and 12C illustrate cross-sectional views of the exemplary detector of FIG. 12A. The exemplary detector 400C includes transfer gates 120A, 120B, floating diffusion nodes 105A and 105B, and a PTR drain 181. In the exemplary detector 400C, the draining process is controlled by the bias on the PTR drain 181. For example, a relatively high bias (e.g., 2.5V-3V) can trigger the punch-through effect between the storage well 140 (shown in FIGS. 12B and 12C) and the PTR drain 181. The bias voltage creates a current path between the storage well 140 and the PTR drain 181, and the charge in the storage well 140 transfers to the PTR drain 181 via the current path. A relatively low bias (e.g., 0.5-1.5V) may be used to stop the punch-through and form a potential barrier between the storage well 140 and the PTR drain 181 to prevent any charge from flowing.

Figure 13:
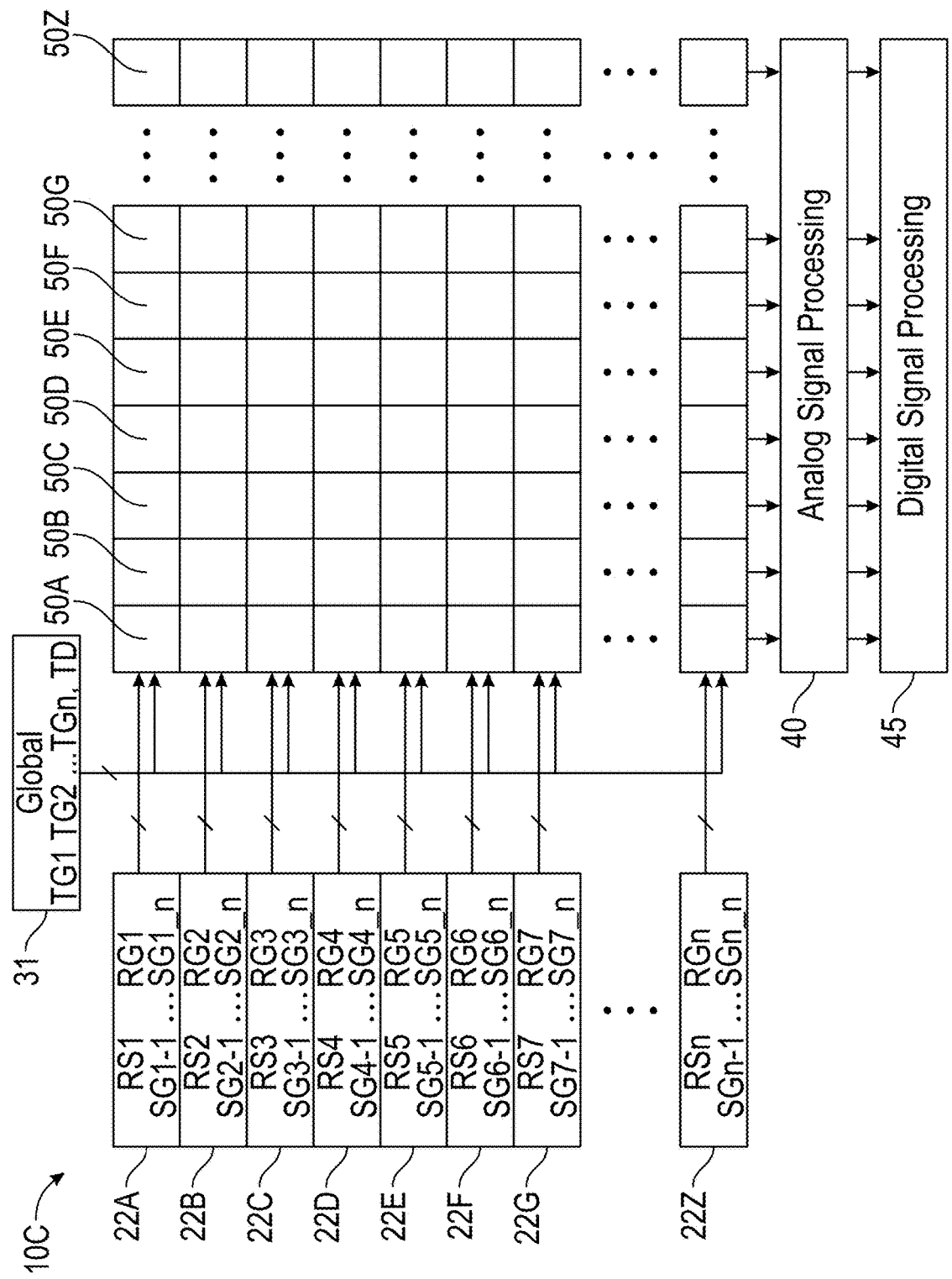
FIG. 13 is an illustration of an exemplary multi-tap time-resolved sensor with in-pixel storage nodes in accordance with some embodiments.

In applications that employ correlated double sampling (e.g., to reduce the kTC noise (e.g., for FLIM and other low-light applications)), in-pixel storage nodes 115 may be provided along with a pump gate structures to enable the floating diffusion nodes 105 to be reset prior to final charge transfer from the storage nodes 115 to the floating diffusion nodes 105. FIG. 13 is an illustration of an exemplary multi-tap time-resolved sensor apparatus 10C with detectors 50A, 50B, etc. that have in-pixel storage nodes in accordance with some embodiments. The exemplary multi-tap time-resolved sensor apparatus 10C includes an array of detectors, eight of which are labeled in FIG. 13 as 50A, 50B, 50C, 50D, 50E, 50F, 50G, and 50Z. The array of detectors can be of any suitable size. That the last detector in the first row is labeled as 50Z is for convenience and not to imply that there are exactly 26 detectors in each row of the array. It is to be understood that the global-shutter image sensor apparatus 10C may have any number of detectors 50A, 50B, etc. and, accordingly, any number of rows and any number of columns. The array can be of any size or shape.

Using detectors 50A, 50B, etc. such as those described below in the discussion of FIGS. 14A, 14B, and 14C, the high-resolution temporal profile of a periodic light source can be captured by periodically transferring the signal charge in the storage well 140 to multiple storage nodes 115 sequentially with a fast-switching steering system. After multiple illumination levels, the signal accumulated in the storage nodes 115 can be read out.

FIGS. 14A-14C illustrate a multi-tap time-resolved pump-gate detector 400D with pinned storage nodes 115A, 115B and a shared read-out architecture in accordance with some embodiments. The detector 400D may be used, for example, to implement pairs of detectors (50A and 50B, etc.) in the exemplary multi-tap time-resolved sensor 10C shown in FIG. 13. FIG. 14A illustrates an exemplary layout (plan view, x-y plane) for the exemplary multi-tap time-resolved pump-gate detector 400D, FIG. 14B illustrates a cross-sectional view of the exemplary detector 400D, and FIG. 14C illustrates a cross-sectional view of the exemplary detector 400D of FIG. 14A with exemplary control and readout circuitry 235 in accordance with some embodiments.

The exemplary detector 400D includes many of the same elements described in the context of other figures herein, such as, for example, signal gates 110A, 110B, storage nodes 115A, 115B, transfer gates 120A, 120B, transfer drain gates 180A, 180B, and drains 185A, 185B. The previous explanations of the operation of these elements apply here and are not repeated. The exemplary detector 400D also includes a shared floating diffusion node 105.

In the exemplary detector 400D shown in FIGS. 14A-14C, the storage nodes 115A, 115B are separated from the floating diffusion node 105 by horizontal pump gate structures 130A, 130B, respectively. As shown, the pump gate structure 130A is situated between the first storage node 115A and the floating diffusion node 105. The pump gate structure 130A includes a p-type barrier (PB) layer adjacent to the storage node 115A, a virtual barrier (VB) adjacent to the floating diffusion node 105, and a p-type well (PW) between and adjacent to the p-type barrier and the virtual barrier. Likewise, the pump gate structure 130B includes a p-type barrier (PB) layer adjacent to the storage node 115B, a virtual barrier (VB) adjacent to the floating diffusion node 105, and a p-type well (PW) between and adjacent to the p-type barrier and the virtual barrier. The horizontal pump gate structures 130A, 130B improve the conversion gain and reduce the read noise.

As shown in FIGS. 14B and 14C, a storage well 140 is situated underneath the storage nodes 115A, 115B and separated from the storage nodes 115A, 115B, the pump gate structures 130A, 130B, and the floating diffusion node 105 by a p-type layer 148. To isolate the storage well 140 from the storage nodes 115A, 115B and the floating diffusion node 105, the p-type layer 148 may be heavily-doped. Because the p-type layer 148 is situated above the storage well 140, it provides electrical isolation without blocking the charge transfer path from the storage well 140 to the storage nodes 115A, 115B. The position of the storage well 140 shields the storage nodes 115A, 115B from incident photons also reduces the lateral footprint of the detector 400D.

Although the example detector 400D shown in FIGS. 14A-14C is a two-tap detector, it will be apparent from the disclosures herein that the detector may be expanded in a straightforward manner to include additional taps (e.g., four or more) to improve the temporal resolution further. Because the storage well 140 is underneath the storage nodes 115, multiple storage nodes 115 can share one floating diffusion node 105 readout chain (e.g., shown in FIG. 14C as including MOSFET transistors 230A, 230B, 230C, although, as explained previously, other components can be used instead or in addition) without sacrificing the fill-factor or the conversion gain. This design provides a substantial improvement over prior art approaches.

Referring again to FIG. 13, the exemplary multi-tap time-resolved sensor apparatus 10C includes global transfer gate and transfer drain circuitry 31 coupled to each row of the detector array.

When the detectors 50A, 50B, etc. of the detector array of FIG. 13 are the exemplary detector 400D, the global transfer gate and transfer drain circuitry 31 may be connected or coupled, for example, to each of the transfer gates 120A, 120B and transfer drain gates 185A, 185B shown in FIGS. 14A-14C. In operation, periodic pulse signals generated by the global transfer gate and transfer drain circuitry 31 may be applied to selected transfer gates 120A, 120B of detectors 400D in a row of the detector array to transfer the signal charge from each detector 400D's storage well 140 to the floating diffusion nodes 105. This operation occurs substantially simultaneously within all detectors (e.g., 400D) of the pixel array (i.e., globally). In addition, the global transfer gate and transfer drain circuitry 31 generates and applies global transfer drain pulse signals to the transfer drain gates 185 of all of the detectors in the array. The global transfer drain pulse signals are applied substantially simultaneously to all detectors of the pixel array (i.e., globally).

The exemplary multi-tap time-resolved sensor apparatus 10C includes, for each row, control and readout circuitry, labeled in FIG. 13 as 22A, 22B, 22C, 22D, 22E, 22F, 22G, and 22Z. That the last row of control and readout circuitry is labeled as 22Z is for convenience and not to imply that there are exactly 26 rows in the array of detectors. It is to be understood that the exemplary multi-tap time-resolved sensor apparatus 10C may have any number of rows (and the corresponding control and readout circuitry for each row) and any number of columns. Each instance of the control and readout circuitry 22A, 22B, etc. provides a reset signal (RGx), a set of signal gate pulses (SGx−1, SGx−2, . . . ), and a row select signal (RSx).

After the integration period, signals may be read out (e.g., sequentially, generally row-by-row with read-out parallelism with respect to pixels in a given row, via column lines coupled to respective detectors (e.g., 50A, 50B, etc.) in the row). As described above, the signals obtained from the detectors 50A, 50B, etc. may be subjected to analog signal processing 40 and/or digital signal processing 45 using any suitable techniques.

Figure 15A:
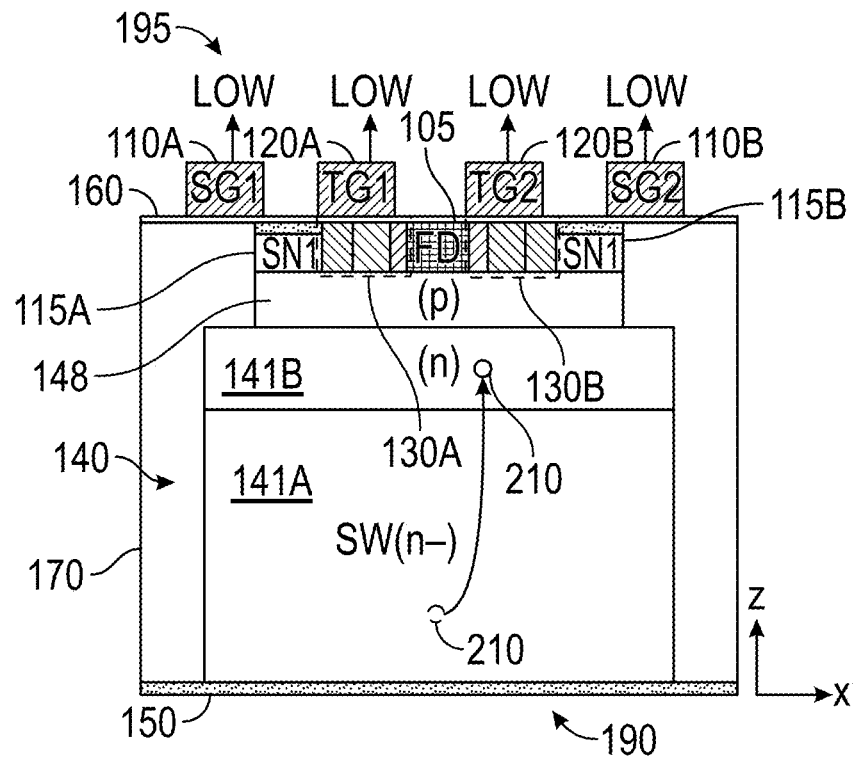
FIGS. 15A, 15B, 15C, and 15D illustrate how charge can be transferred by the exemplary detector illustrated in FIGS. 14A-14C in accordance with some embodiments.
Figure 15B:
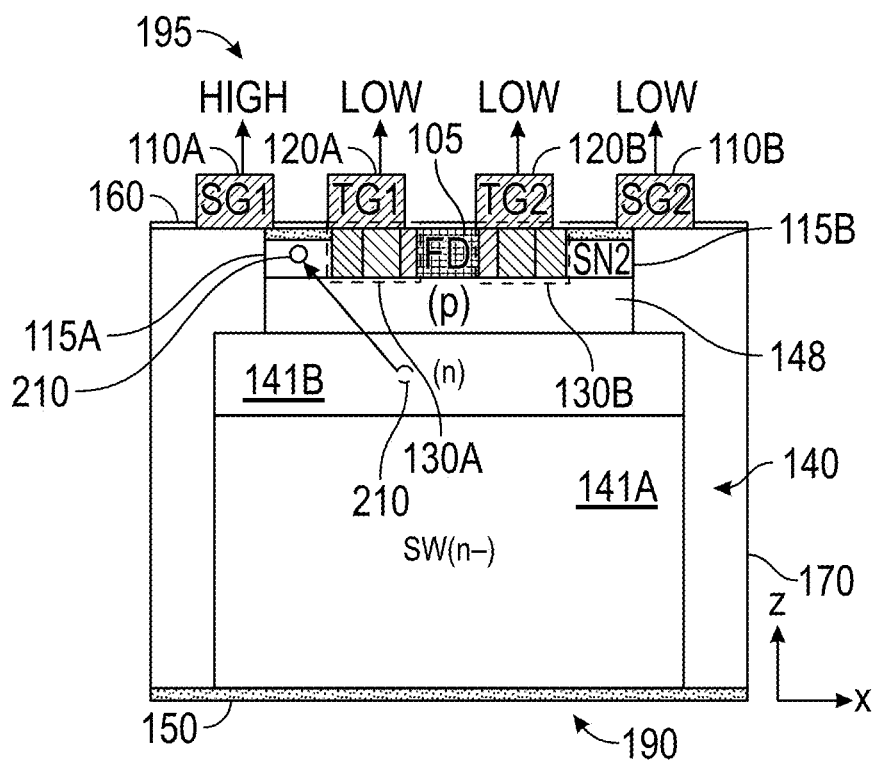
Figure 15C:
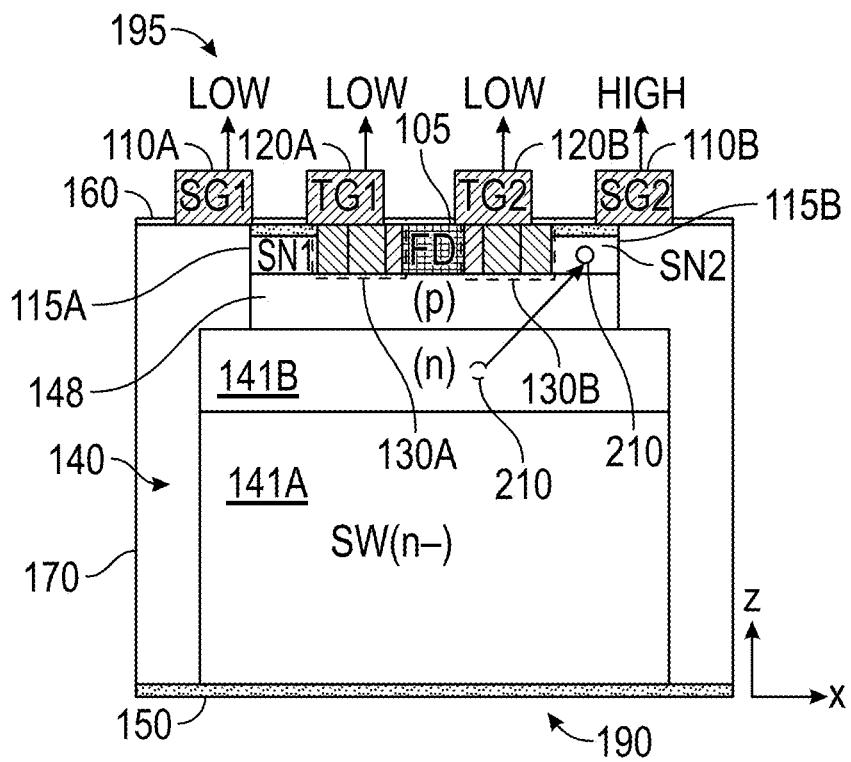

FIGS. 15A, 15B, 15C, and 15D illustrate how signal charge can be transferred by the exemplary detector 400D illustrated in FIGS. 14A-14C in accordance with some embodiments. During the integration period, shown in FIG. 15A, the signal gates 110A, 110B and the transfer gates 120A, 120B are held low, and the signal charge 210 accumulates in the storage well 140, typically in the shallow region 141B when the storage well 140 has a doping gradient as described herein and shown in FIGS. 15A-15D. As shown in FIG. 15B, the signal charge 210 can be transferred from the storage well 140 to the storage node 115A by applying a bias to the signal gate 110A. As described previously in the context of other drawings herein, the signal charge 210 can be transferred from the storage node 115A to the floating diffusion node 105 by applying a positive bias to the transfer gate 120A. As shown in FIG. 15C, the signal charge 210 can be transferred from the storage well 140 to the storage node 115B by applying a bias to the signal gate 110B. The signal charge 210 can be transferred from the storage node 115B to the floating diffusion node 105 by applying a positive bias to the transfer gate 120B.

Figure 15D:
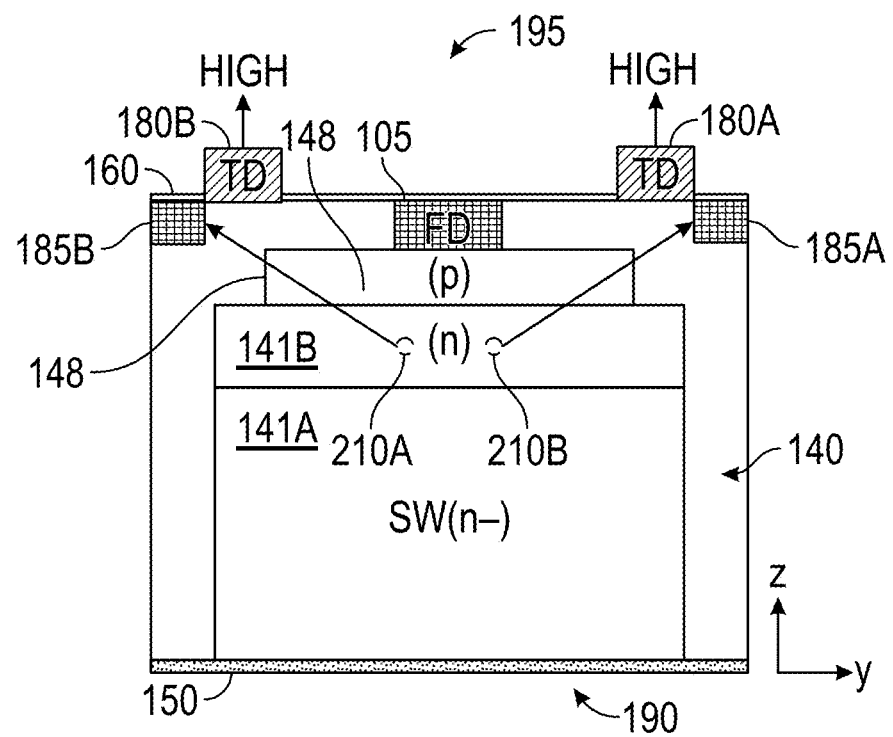

As illustrated in FIG. 15D, while waiting for the next illumination cycle, the redundant signal charge 210 in the storage well 140 may be directed the transfer drains 185A, 185B by applying a bias voltage to the transfer drain gates 180A, 180B (e.g., globally as described above). As explained previously in the context of FIGS. 12A-12C, the transfer drain gates 180A, 180B and transfer drains 185A, 185B can be replaced by PTR drains 181.

The innovative features of the disclosed embodiments include, but are not limited to, for example:

A backside illuminated image sensor pixel structure having a junction memory node for temporarily storing the photo-generated charge from one integration period.

The storage memory node being located vertically above the photosensitive photodiode and shielded from the incident light from the backside surface.

The charge signal in photodiode can be vertically transferred to the memory node by pulsing one poly gate.

The charge signal in the storage memory node can be horizontally transferred to the output capacitor—floating diffusion for signal read-out.

A horizontal pump gate doping structure can be implemented between the storage memory node and floating diffusion node to reduce the gate parasitic capacitance on the floating diffusion node.

The proposed pixel structures can be implemented into a multi-tap pixel with or without in-pixel storage nodes.

Although the description herein is in the context of global shutter mode devices, it is to be understood that the disclosed concepts can also be used in rolling shutter mode. Furthermore, although the description herein is in the context of BSI image sensors, it will be appreciated that certain of the disclosures herein are applicable to FSI image sensors.

It is also to be understood that although many of the drawings illustrate certain exemplary control and readout circuitry 235, as explained in the discussion of FIGS. 6A-6C, other circuit elements (e.g., punch-through diodes, JFET transistors) may be substituted for or used in addition to some or all of those elements to meet design, cost, complexity, and/or other objectives.

Furthermore, although the some of the discussion above explicitly describes how elements of certain embodiments may be incorporated into other embodiments, this disclosure does not attempt to explicitly set forth all possible permutations and combinations of the described features and elements. A failure to explicitly set forth a particular combination or permutation above does not mean that such combination or permutation is not within the scope of the disclosure or was not contemplated. It is to be appreciated that, in general, the disclosed features and elements can be used advantageously in multiple embodiments in various combinations and permutations.

In the foregoing description and in the accompanying drawings, specific terminology has been set forth to provide a thorough understanding of the disclosed embodiments. In some instances, the terminology or drawings may imply specific details that are not required to practice the invention.

To avoid obscuring the present disclosure unnecessarily, well-known components are shown in block diagram form and/or are not discussed in detail or, in some cases, at all.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used in the specification and the appended claims, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to."

The terms "exemplary" and "embodiment" are used to express examples, not preferences or requirements.

The term "coupled" is used herein to express a direct connection/attachment as well as a connection/attachment through one or more intervening elements or structures.

The terms "over," "under," "between," and "on" are used herein refer to a relative position of one feature with respect to other features. For example, one feature disposed "over," "under," or "on" another feature may be directly in contact with the other feature or may have intervening material. Moreover, one feature disposed "between" two features may be directly in contact with the two features or may have one or more intervening features or materials.

Furthermore, spatially-relative terms, such as "beneath," "below," "lower," "above," "upper" and the like, may be used herein for ease of description to describe the relationship of one element or feature to another element or feature (or multiple other elements or features) as illustrated in the figures. The spatially-relative terms are intended to encompass different orientations of the device in use or operation in addition to the orientation depicted in the figures. The apparatus may be otherwise oriented (rotated 90 degrees or at other orientations) and the spatially-relative descriptors used herein may likewise be interpreted accordingly.

The term "substantially" is used to describe a structure, configuration, dimension, etc. that is largely or nearly as stated, but, due to manufacturing tolerances and the like, may in practice result in a situation in which the structure, configuration, dimension, etc. is not always or necessarily precisely as stated. For example, describing two lengths as "substantially equal" means that the two lengths are the same for all practical purposes, but they may not (and need not) be precisely equal at sufficiently small scales. As another example, a structure that is "substantially vertical" would be considered to be vertical for all practical purposes, even if it is not precisely at 90 degrees relative to horizontal.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An image sensor apparatus, comprising:
a frontside surface;
a backside surface;
a storage region, the storage region being situated closer to the frontside surface than to the backside surface;
a storage well situated between the backside surface and the storage region; and
a doping region situated between the storage region and the storage well,
wherein:
the doping region is p-type, and the storage well and the storage region are n-type,
a lateral area of the storage well is greater than or equal to a lateral area of the storage region, and
at every plane parallel to the frontside surface within the image sensor apparatus, no portion of a lateral perimeter of the storage region extends outside of a lateral perimeter of the storage well.

2. The image sensor apparatus recited in claim 1, wherein the storage region comprises a storage node or a floating diffusion node.

3. The image sensor apparatus recited in claim 1, further comprising a pinning layer disposed between the storage region and the frontside surface, the pinning layer being situated adjacent to the storage region.

4. The image sensor apparatus recited in claim 1, further comprising:
a transfer gate formed on the frontside surface, wherein the transfer gate is configured to cause charge to transfer from the storage well to the storage region in response to a bias applied to the transfer gate.

5. The image sensor apparatus recited in claim 4, wherein the transfer gate is situated over at least a portion of the storage well.

6. The image sensor apparatus recited in claim 4, wherein the storage region is a storage node, and wherein, in a plan view of the image sensor apparatus, the transfer gate extends laterally around at least a portion of the storage node.

7. The image sensor apparatus recited in claim 1, wherein the storage well comprises a shallow region and a deep region, the deep region being situated between the backside surface and the shallow region, and wherein a doping of the shallow region is heavier than a doping of the deep region.

8. The image sensor apparatus recited in claim 1, wherein the storage region is a storage node, and further comprising a floating diffusion node situated between the frontside surface and the backside surface.

9. The image sensor apparatus recited in claim 8, further comprising circuitry coupled to the floating diffusion node.

10. The image sensor apparatus recited in claim 8, further comprising:
a pump gate structure disposed between the storage node and the floating diffusion node, wherein the pump gate structure is configured to cause charge to transfer from the storage node to the floating diffusion node in response to a bias applied to a signal gate coupled to the pump gate structure.

11. The image sensor apparatus recited in claim 10, wherein the pump gate structure comprises a virtual barrier region, a p-type barrier region, and a p-type well region situated between the virtual barrier region and the p-type barrier region.

12. The image sensor apparatus recited in claim 11, wherein the p-type barrier region is adjacent to the storage node, and the virtual barrier region is adjacent to the floating diffusion node.

13. The image sensor apparatus recited in claim 1, wherein the storage region is a first storage node and the storage well is a first storage well, and further comprising:
a second storage node, the second storage node being situated closer to the frontside surface than to the backside surface;
a second storage well situated between the backside surface and the second storage node, wherein a lateral area of the second storage well is greater than or equal to a lateral area of the second storage node, and no portion of a lateral perimeter of the second storage node extends outside of a lateral perimeter of the second storage well;
a floating diffusion node disposed between the first and second storage nodes;
circuitry coupled to the floating diffusion node;
a first transfer gate formed on the frontside surface and configured to cause a first charge to transfer from the first storage well to the first storage node in response to a voltage applied to the first transfer gate;
a first signal gate formed on the frontside surface and configured to cause the first charge to transfer from the first storage node to the floating diffusion node in response to a voltage applied to the first signal gate;
a second transfer gate formed on the frontside surface and configured to cause a second charge to transfer from the second storage well to the second storage node in response to a voltage applied to the second transfer gate; and
a second signal gate formed on the frontside surface and configured to cause the second charge to transfer from the second storage node to the floating diffusion node in response to a voltage applied to the second signal gate.

14. The image sensor apparatus recited in claim 13, further comprising:
a first pump gate structure disposed between the first storage node and the floating diffusion node, wherein the first pump gate structure is configured to direct the first charge from the first storage node to the floating diffusion node in response to the voltage applied to the first signal gate, the first signal gate being coupled to the first pump gate structure; and
a second pump gate structure disposed between the second storage node and the floating diffusion node, wherein the second pump gate structure is configured to direct the second charge from the second storage node to the floating diffusion node in response to the voltage applied to the second signal gate, the second signal gate being coupled to the second pump gate structure.

15. The image sensor apparatus recited in claim 13, wherein the floating diffusion node is a first floating diffusion node, and further comprising:
a third storage node, the third storage node being situated closer to the frontside surface than to the backside surface;
a third storage well situated between the backside surface and the third storage node;
a fourth storage node, the fourth storage node being situated closer to the frontside surface than to the backside surface;
a fourth storage well situated between the backside surface and the fourth storage node;
a second floating diffusion node disposed between the third and fourth storage nodes and coupled to the first floating diffusion node;

a third transfer gate formed on the frontside surface and configured to cause a third charge to transfer from the third storage well to the third storage node in response to a voltage applied to the third transfer gate;

a third signal gate formed on the frontside surface and configured to cause the third charge to transfer from the third storage node to the second floating diffusion node in response to a voltage applied to the third signal gate;

a fourth transfer gate formed on the frontside surface and configured to cause a fourth charge to transfer from the fourth storage well to the fourth storage node in response to a voltage applied to the fourth transfer gate; and a fourth signal gate formed on the frontside surface and configured to cause the fourth charge to transfer from the fourth storage node to the second floating diffusion node in response to a voltage applied to the fourth signal gate, and wherein the circuitry is coupled to the first and second floating diffusion nodes.

16. The image sensor apparatus recited in claim 13, further comprising:
a third storage node, the third storage node being situated closer to the frontside surface than to the backside surface;
a third storage well situated between the backside surface and the third storage node;
a fourth storage node, the fourth storage node being situated closer to the frontside surface than to the backside surface;
a fourth storage well situated between the backside surface and the fourth storage node;
a third transfer gate formed on the frontside surface and configured to cause a third charge to transfer from the third storage well to the third storage node in response to a voltage applied to the third transfer gate;
a third signal gate formed on the frontside surface configured to cause the third charge to transfer from the third storage node to the floating diffusion node in response to a voltage applied to the third signal gate;
a fourth transfer gate formed on the frontside surface configured to cause a fourth charge to transfer from the fourth storage well to the fourth storage node in response to a voltage applied to the fourth transfer gate; and
a fourth signal gate formed on the frontside surface configured to cause the fourth charge to transfer from the fourth storage node to the floating diffusion node in response to a voltage applied to the fourth signal gate.

17. The image sensor apparatus recited in claim 1, wherein the storage region comprises a floating diffusion node.

18. The image sensor apparatus recited in claim 17, further comprising:
a first storage node;
a second storage node;
a first horizontal pump gate structure situated between and adjacent to the first storage node and a first side of the floating diffusion node; and
a second horizontal pump gate structure situated between and adjacent to the second storage node and a second side of the floating diffusion node,
wherein each of the first and second horizontal pump gate structures is a multi-layer structure comprising a p-type barrier region, a virtual barrier region, and a p-type well region sandwiched between the p-type barrier region and the virtual barrier region.

19. The image sensor apparatus recited in claim 18, wherein each of the virtual barrier regions is adjacent to the floating diffusion node.

20. The image sensor apparatus recited in claim 18, further comprising:
a first signal gate formed on the frontside surface, the first signal gate configured to cause first signal charge to transfer from the storage well to the first storage node in response to a first bias applied to the first signal gate;
a second signal gate formed on the frontside surface, the second signal gate configured to cause second signal charge to transfer from the storage well to the second storage node in response to a second bias applied to the second signal gate;
a first transfer gate formed on the frontside surface above the first horizontal pump gate structure, the first transfer gate configured to cause the first signal charge to transfer from the first storage node, through the first horizontal pump gate structure, and to the floating diffusion node in response to a third bias applied to the first transfer gate; and
a second transfer gate formed on the frontside surface above the second horizontal pump gate structure, the second transfer gate configured to cause the second signal charge to transfer from the second storage node, through the second horizontal pump gate structure, and to the floating diffusion node in response to a fourth bias applied to the second transfer gate.

21. The image sensor apparatus recited in claim 20, further comprising circuitry coupled to the floating diffusion node.

22. The image sensor apparatus recited in claim 21, wherein the circuitry comprises at least one transistor or diode.

23. The image sensor apparatus recited in claim 17, further comprising:
a drain region; and
a transfer drain gate formed on the frontside surface, wherein the transfer drain gate is configured to cause excess charge to transfer from the storage well to the drain region in response to a bias applied to the transfer drain gate.

24. An image sensor apparatus, further comprising:
a frontside surface;
a backside surface;
a storage node, the storage node being situated closer to the frontside surface than to the backside surface;
a storage well situated between the backside surface and the storage node;
a doping region situated between the storage node and the storage well;
a floating diffusion node situated between the frontside surface and the backside surface;
a signal gate; and
a pump gate structure disposed between the storage node and the floating diffusion node and coupled to the signal gate,
wherein:
an impurity type of the doping region is opposite an impurity type of the storage well,
a lateral area of the storage well is greater than or equal to a lateral area of the storage node,
no portion of a lateral perimeter of the storage node extends outside of a lateral perimeter of the storage well, the pump gate structure is configured to cause charge to transfer from the storage node to the floating diffusion node in response to a bias applied to the signal gate, the signal gate is formed on the frontside surface, and the pump gate structure is horizontal and is situated, at least in part, under the signal gate.

25. The image sensor apparatus recited in claim 24, further comprising:

a transfer gate formed on the frontside surface, wherein the transfer gate is configured to cause charge to transfer from the storage well to the storage node in response to a bias applied to the transfer gate.

26. A method of using the image sensor apparatus recited in claim 25, comprising:

biasing the transfer gate at a first time;

biasing the signal gate at a second time, the second time being after the first time; and reading the floating diffusion node after biasing the signal gate at the second time, wherein reading the floating diffusion node comprises performing correlated double sampling.

27. An image sensor having a frontside surface and a backside surface, the image sensor comprising:

a storage well situated between the backside surface and the frontside surface;

a pump gate structure situated between the storage well and the frontside surface, a first doping region of the pump gate structure being adjacent to the storage well;

a first floating diffusion node situated adjacent to a first side of the pump gate structure;

a second floating diffusion node situated adjacent to a second side of the pump gate structure;

a first transfer gate configured to direct charge from the storage well to the first floating diffusion node in response to a bias applied to the first transfer gate; and a second transfer gate configured to direct the charge from the storage well to the second floating diffusion node in response to a bias applied to the second transfer gate.

28. The image sensor recited in claim 27, wherein the storage well comprises a shallow region and a deep region, the deep region being situated between the backside surface and the shallow region, and wherein a doping of the shallow region is heavier than a doping of the deep region.

29. The image sensor recited in claim 27, further comprising circuitry coupled to the first and second floating diffusion nodes.

30. The image sensor recited in claim 27, wherein the pump gate structure comprises a plurality of doping regions.

31. The image sensor recited in claim 27, wherein the pump gate structure comprises a p-type barrier adjacent to the storage well and a multi-layer structure situated (a) between the p-type barrier and the frontside surface and (b) between the first and second floating diffusion nodes, wherein the multi-layer structure comprises a first virtual barrier region, a first p-type well region, a p-type region, a second p-type well region, and a second virtual barrier region, wherein the first and second p-type well regions are situated between the first and second virtual barrier regions, and the p-type region is situated between the first and second p-type well regions.

32. The image sensor recited in claim 31, wherein a doping of the p-type region is higher than a doping of the first p-type well region and a doping of the second p-type well region.

33. The image sensor recited in claim 31, wherein the first virtual barrier region is adjacent to the first floating diffusion node, and the second virtual barrier region is adjacent to the second floating diffusion node.

34. The image sensor recited in claim 27, further comprising:

a drain region; and a transfer drain gate formed on the frontside surface, wherein the transfer drain gate is configured to cause charge to transfer from the storage well to the drain region in response to a bias applied to the transfer drain gate.

35. The image sensor recited in claim 27, further comprising:

a punch-through reset drain configured to cause charge to transfer from the storage well in response to a bias exceeding a threshold.

* * * * *